(12) United States Patent
Ahn et al.

(10) Patent No.: US 11,282,921 B2
(45) Date of Patent: Mar. 22, 2022

(54) SEMICONDUCTOR DEVICE AND METHOD OF MANUFACTURING THE SAME

(71) Applicant: SAMSUNG ELECTRONICS CO., LTD., Suwon-si (KR)

(72) Inventors: Gyuhwan Ahn, Gunpo-si (KR); Sung Soo Kim, Hwaseong-si (KR); Chaeho Na, Changwon-si (KR); Woongsik Nam, Seoul (KR); Donghyun Roh, Suwon-si (KR)

(73) Assignee: SAMSUNG ELECTRONICS CO., LTD.

( * ) Notice: Subject to any disclaimer, the term of this patent is extended or adjusted under 35 U.S.C. 154(b) by 0 days.

(21) Appl. No.: 16/903,015

(22) Filed: Jun. 16, 2020

(65) Prior Publication Data
US 2021/0118991 A1 Apr. 22, 2021

(30) Foreign Application Priority Data

Oct. 21, 2019 (KR) ........................ 10-2019-0130689

(51) Int. Cl.
*H01L 29/06* (2006.01)
*H01L 29/08* (2006.01)
(Continued)

(52) U.S. Cl.
CPC .... *H01L 29/0653* (2013.01); *H01L 21/02532* (2013.01); *H01L 21/02603* (2013.01); *H01L 21/76229* (2013.01); *H01L 21/823412* (2013.01); *H01L 21/823418* (2013.01); *H01L 21/823431* (2013.01); *H01L 21/823475* (2013.01); *H01L 21/823481* (2013.01); *H01L 27/0886* (2013.01); *H01L 29/0673* (2013.01);
(Continued)

(58) Field of Classification Search
CPC ........... H01L 27/0886; H01L 21/76229; H01L 29/0653; H01L 29/42392; H01L 29/66795; H01L 21/76816
See application file for complete search history.

(56) References Cited

U.S. PATENT DOCUMENTS 5,930,646 A 7/1999 Gerung et al.
6,475,875 B1 11/2002 Hau et al.
(Continued)

FOREIGN PATENT DOCUMENTS

KR 10-2005-0002439 A 1/2005
KR 10-0703836 B1 3/2007

*Primary Examiner* — Changhyun Yi
(74) *Attorney, Agent, or Firm* — Myers Bigel, P.A.

(57) ABSTRACT

A semiconductor device includes first and second active patterns on a substrate, the first and second active patterns adjacent to each other in a first direction with a first trench between the first and second active patterns, third and fourth active patterns on the substrate, the third and fourth active patterns adjacent to each other in the first direction with a second trench between the third and fourth active patterns. The semiconductor device includes a first device isolation layer in the first trench, and a second device isolation layer in the second trench. A width of the second trench in the first direction is greater than a width of the first trench in the first direction. The second device isolation layer includes a first protrusion and a second protrusion which protrude from a top surface of the second device isolation layer.

20 Claims, 39 Drawing Sheets

(51) Int. Cl.
  *H01L 29/78*      (2006.01)
  *H01L 29/423*     (2006.01)
  *H01L 29/786*     (2006.01)
  *H01L 21/02*      (2006.01)
  *H01L 21/762*     (2006.01)
  *H01L 21/8234*    (2006.01)
  *H01L 29/66*      (2006.01)
  *H01L 27/088*     (2006.01)

(52) U.S. Cl.
  CPC .... *H01L 29/0847* (2013.01); *H01L 29/42392* (2013.01); *H01L 29/66795* (2013.01); *H01L 29/7851* (2013.01); *H01L 29/78618* (2013.01); *H01L 29/78696* (2013.01)

(56) References Cited

U.S. PATENT DOCUMENTS

| | | |
|---|---|---|
| 6,656,817 B2 | 12/2003 | Divakaruni et al. |
| 6,660,599 B2 | 12/2003 | Han et al. |
| 6,686,283 B1 | 2/2004 | Walsh et al. |
| 6,740,955 B1 | 5/2004 | Hong et al. |
| 9,123,771 B2 | 9/2015 | Shen et al. |
| 9,219,115 B2 | 12/2015 | Colinge |
| 9,397,158 B2 | 7/2016 | Cai et al. |
| 10,038,093 B2 | 7/2018 | Sung et al. |
| 10,373,861 B1 * | 8/2019 | Hsieh .................. H01L 29/7853 |
| 2009/0127648 A1 | 5/2009 | Chen et al. |
| 2016/0365253 A1 | 12/2016 | Chen et al. |
| 2018/0151414 A1 * | 5/2018 | Wu .................... H01L 29/0653 |
| 2019/0043761 A1 | 2/2019 | Min et al. |
| 2020/0043742 A1 * | 2/2020 | Chang ............... H01L 29/66742 |

\* cited by examiner

SEMICONDUCTOR DEVICE AND METHOD OF MANUFACTURING THE SAME

CROSS-REFERENCE TO RELATED APPLICATION

This U.S. non-provisional patent application claims priority under 35 U.S.C. § 119 to Korean Patent Application No. 10-2019-0130689, filed on Oct. 21, 2019, in the Korean Intellectual Property Office, the disclosure of which is hereby incorporated by reference in its entirety.

BACKGROUND

Embodiments of the inventive concepts relate to a semiconductor device and, more particularly, to a semiconductor device including a field effect transistor and a method of manufacturing the same.

Semiconductor devices are widely used in an electronic industry because of their small sizes, multi-functional characteristics, and/or low manufacturing costs. Some semiconductor devices may be categorized as semiconductor memory devices for storing logical data, semiconductor logic devices for processing logical data, and hybrid semiconductor devices having both the function of the semiconductor memory devices and the function of the semiconductor logic devices. Semiconductor devices with excellent characteristics have been in demand with the development of the electronics industry. For example, highly reliable, high-speed, and/or multi-functional semiconductor devices have been increasingly in demand. To satisfy these demands, semiconductor devices have been highly integrated and structures in semiconductor devices have become more complicated.

SUMMARY

Embodiments of the inventive concepts may provide a semiconductor device with improved electrical characteristics.

Embodiments of the inventive concepts may also provide a method of manufacturing a semiconductor device with improved electrical characteristics.

In some embodiments, a semiconductor device may include a first active pattern and a second active pattern on a substrate, the first and second active patterns adjacent to each other in a first direction with a first trench between the first and second active patterns, a third active pattern and a fourth active pattern on the substrate, the third and fourth active patterns adjacent to each other in the first direction with a second trench between the third and fourth active patterns, a first device isolation layer in the first trench, and a second device isolation layer in the second trench. A width of the second trench in the first direction may be greater than a width of the first trench in the first direction. The second device isolation layer may include a first protrusion and a second protrusion which protrude from a top surface of the second device isolation layer.

In some embodiments, a semiconductor device may include a substrate including an active region, a device isolation layer on the substrate that defines active patterns on the active region. The active patterns may be in a first direction. The semiconductor device includes source/drain patterns in upper portions of the active patterns, such that gate electrodes are intersecting the active patterns and extending in the first direction. The gate electrodes are in a second direction intersecting the first direction, and an interlayer insulating layer overlaps the source/drain patterns and the gate electrodes. The active patterns may include a first active pattern and a second active pattern adjacent to each other in the first direction, and a third active pattern and a fourth active pattern adjacent to each other in the first direction. The device isolation layer may include a first device isolation layer between the first and second active patterns, and a second device isolation layer between the third and fourth active patterns. A width of the second device isolation layer in the first direction may be greater than a width of the first device isolation layer in the first direction. The second device isolation layer may include a first protrusion and a second protrusion which protrude from a top surface of the second device isolation layer.

In some embodiments, a semiconductor device may include a first active pattern and a second active pattern on a substrate with a first trench therebetween, a third active pattern and a fourth active pattern on the substrate, with a second trench therebetween, a first device isolation layer in the first trench, a second device isolation layer in the second trench, and a plurality of semiconductor patterns that are vertically stacked on the active patterns, and a gate electrode overlapping the active patterns, the first trench and the second trench and extending between ones of the plurality of semiconductor patterns, wherein a first distance between the first active pattern and the second active pattern is less than a second distance between the third active pattern and the fourth active pattern, and wherein the second device isolation layer comprises a first protrusion and a second protrusion which protrude from a top surface of the second device isolation layer.

BRIEF DESCRIPTION OF THE DRAWINGS

The inventive concepts will become more apparent in view of the attached drawings and accompanying detailed description.

DETAILED DESCRIPTION

Figure 1:
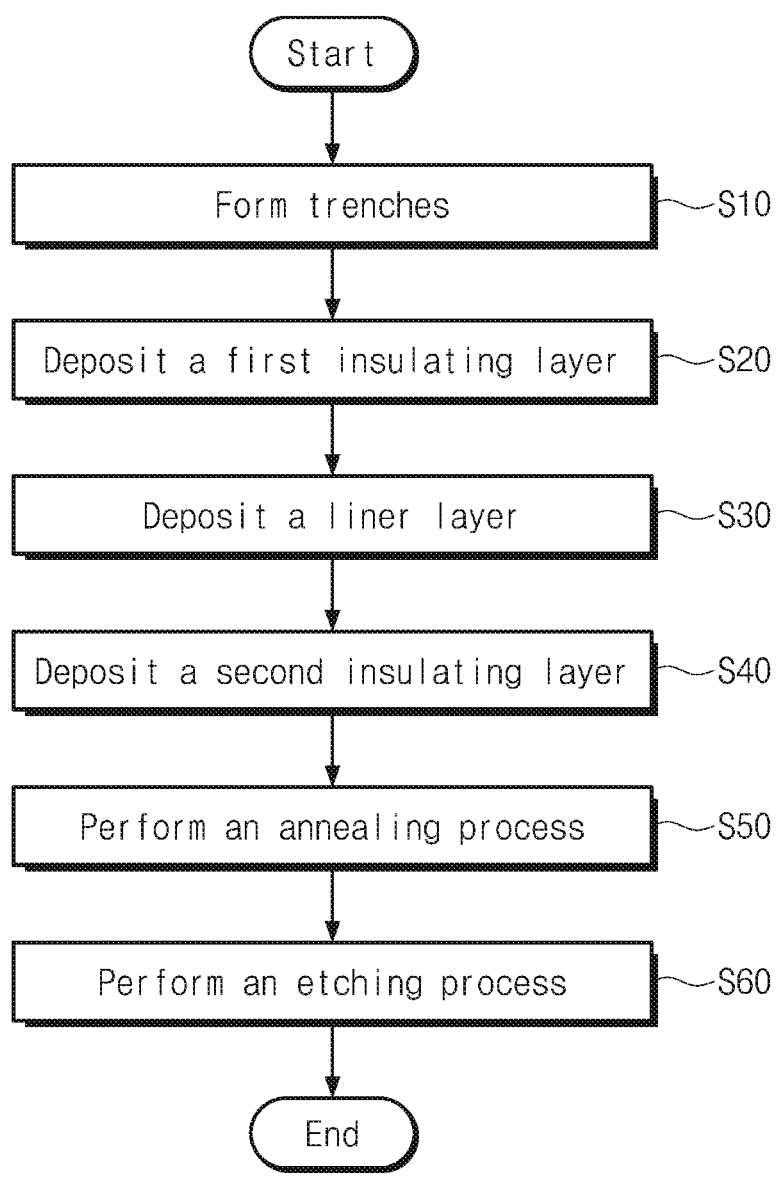
FIG. 1 is a flowchart illustrating a method of manufacturing a semiconductor device, according to some embodiments of the inventive concepts.

FIG. 1 is a flowchart illustrating a method of manufacturing a semiconductor device, according to some embodiments of the inventive concepts. FIGS. 2A to 2E are cross-sectional views illustrating a method of manufacturing a semiconductor device, according to some embodiments of the inventive concepts.

Figure 2A:
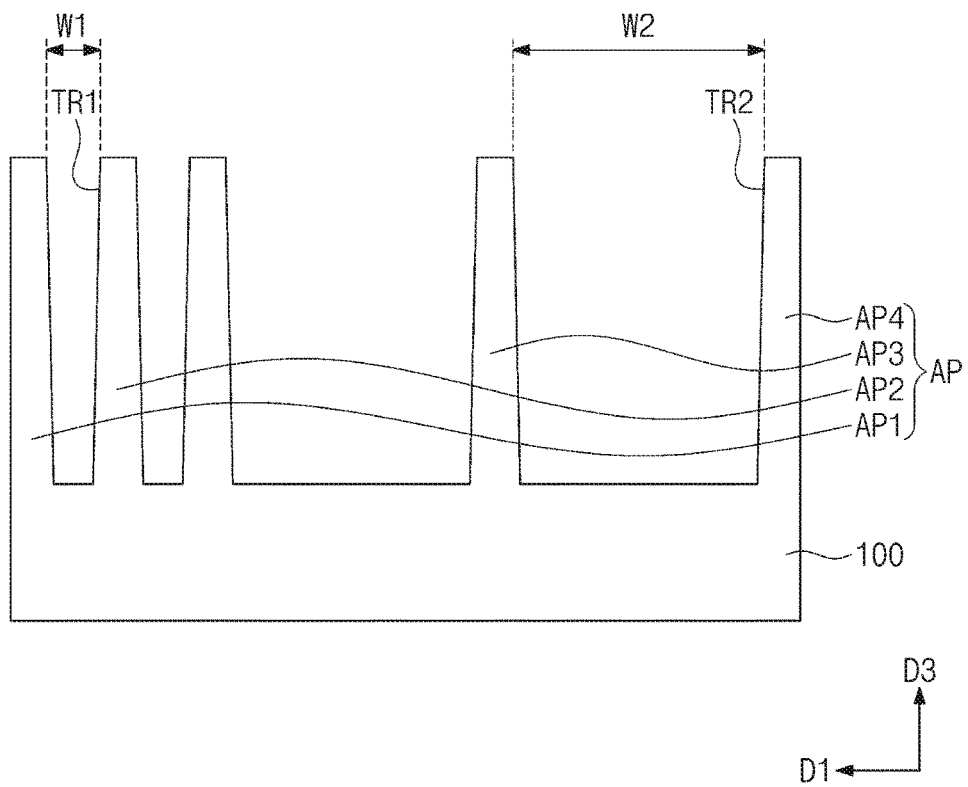
FIGS. 2A to 2E are cross-sectional views illustrating a method of manufacturing a semiconductor device, according to some embodiments of the inventive concepts.

Referring to FIGS. 1 and 2A, a substrate 100 may be provided. The substrate 100 may be patterned to form active patterns AP. The active patterns AP may include first to fourth active patterns AP1, AP2, AP3 and AP4. A first trench TR1 may be formed between the first active pattern AP1 and the second active pattern AP2, and a second trench TR2 may be formed between the third active pattern AP3 and the fourth active pattern AP4 (S10). A width W2 of the second trench TR2 in a first direction D1 may be greater than a width W1 of the first trench TR1 in the first direction D1.

Figure 2B:
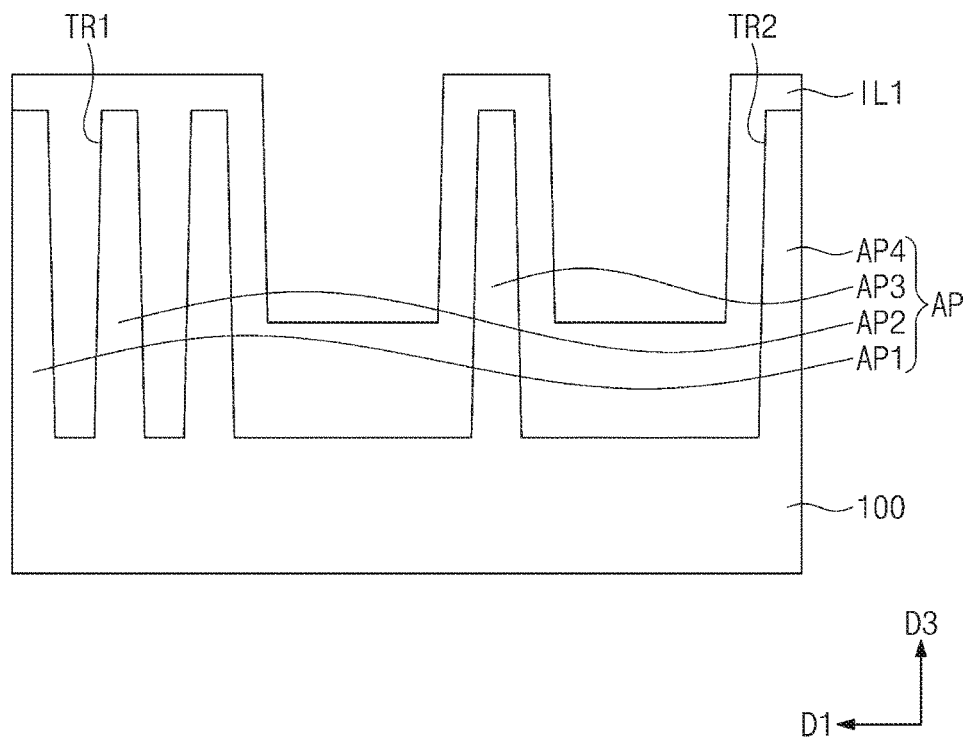

Referring to FIGS. 1 and 2B, a first insulating layer IL1 may be formed on or deposited on the first trench TR1 and the second trench TR2 (S20). The first insulating layer IL1 may include an insulating material such as silicon oxide. The first insulating layer IL1 may be formed by a chemical vapor deposition (CVD) process.

Figure 2C:
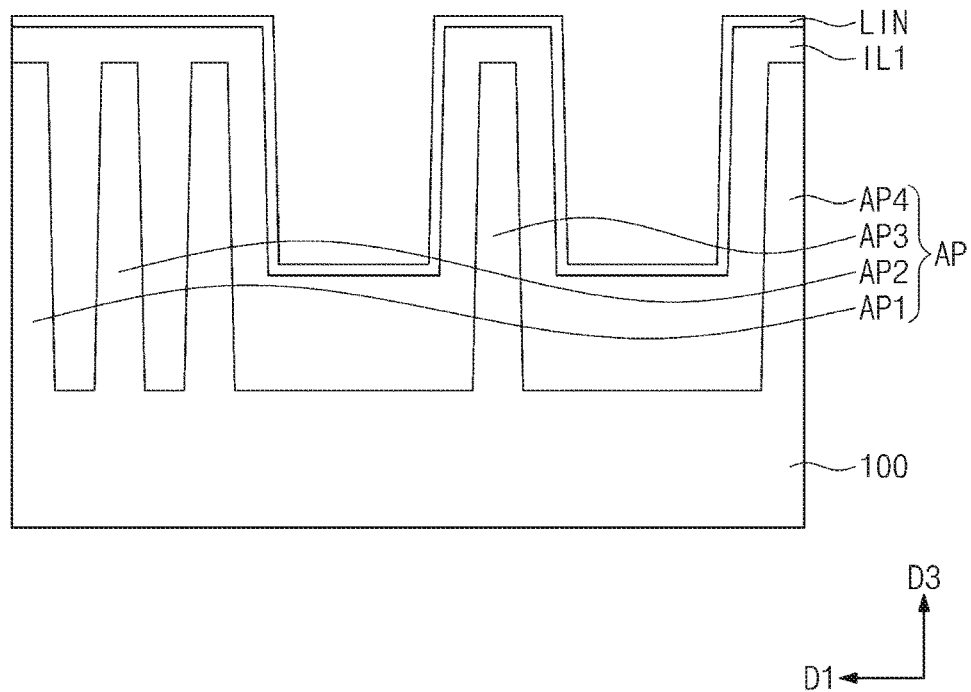

Referring to FIGS. 1 and 2C, a liner layer LIN may be formed on the first insulating layer IL1 (S30). The liner layer LIN may include poly-crystalline silicon or amorphous silicon. The liner layer LIN may be formed by a CVD process.

Figure 2D:
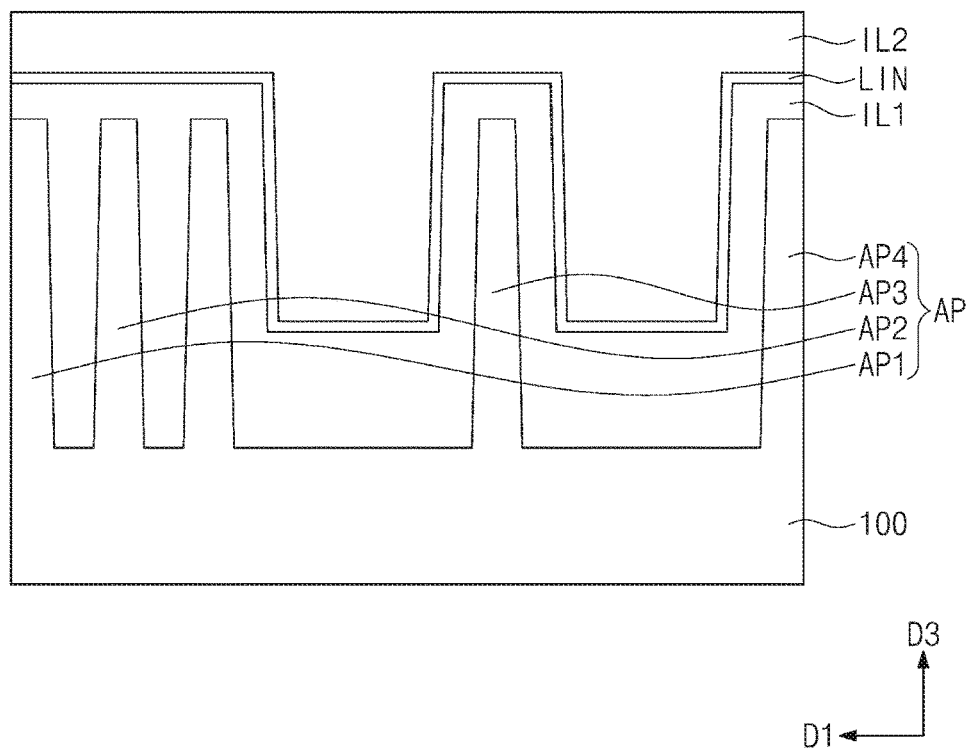

Referring to FIGS. 1 and 2D, a second insulating layer IL2 may be formed on or deposited on the liner layer LIN (S40). The second insulating layer IL2 may include an insulating material such as silicon oxide. The second insulating layer IL2 may be formed by a CVD process.

Figure 2E:
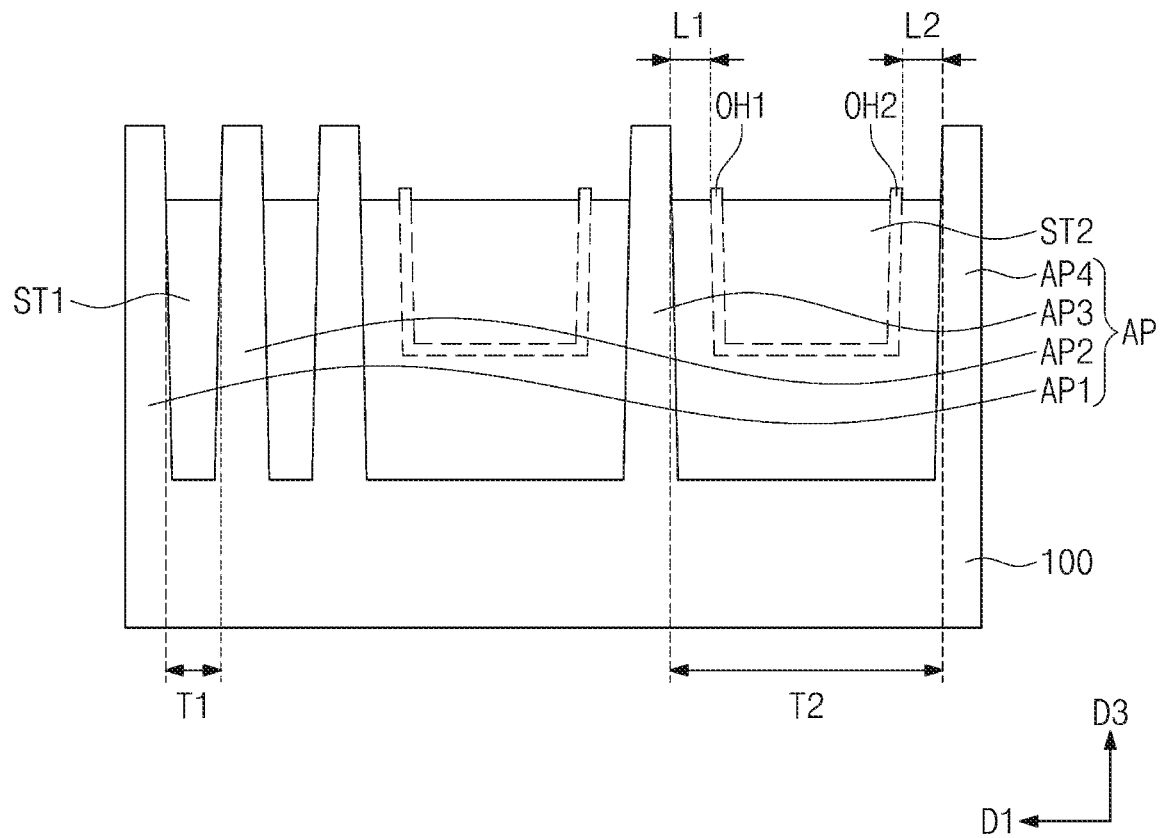

Referring to FIGS. 1 and 2E, an annealing process may be performed on the substrate 100 after the formation of the second insulating layer IL2 (S50). For example, a rapid thermal annealing (RTA) process may be performed as the annealing process.

After performing the annealing process, an etching process may be performed on the second insulating layer IL2 to form a first device isolation layer ST1 and a second device isolation layer ST2 (S60). The first device isolation layer ST1 and the second device isolation layer ST2 may be formed by an anisotropic etching process (e.g., an etch-back process) and/or an isotropic etching process. The first device isolation layer ST1 may be formed in the first trench TR1, and the second device isolation layer ST2 may be formed in the second trench TR2. In other words, the first device isolation layer ST1 may be formed between the first active pattern AP1 and the second active pattern AP2, and the second device isolation layer ST2 may be formed between the third active pattern AP3 and the fourth active pattern AP4. A width T2 of the second device isolation layer ST2 in the first direction D1 may be greater than a width T1 of the first device isolation layer ST1 in the first direction D1.

The proportionality of the device isolation layer may be characterized by an aspect ratio that is based on a height and width of the device isolation layer. For example, an aspect ratio of the first device isolation layer ST1 may be greater than an aspect ratio of the second device isolation layer ST2. For example, the aspect ratio of the first device isolation layer ST1 may range from 25 to 100, and the aspect ratio of the second device isolation layer ST2 may range from 1 to 20. Here, the aspect ratio of the first device isolation layer ST1 may be a ratio of a distance from a top surface to a bottom surface of the first device isolation layer ST1 (i.e., in the third direction D3) to the maximum width of the first device isolation layer ST1 in the first direction D1. The aspect ratio of the second device isolation layer ST2 may be a ratio of a distance from a top surface to a bottom surface of the second device isolation layer ST2 to the maximum width of the second device isolation layer ST2 in the first direction D1.

As illustrated in FIG. 2E, since the etching process is performed, boundaries of the first insulating layer IL1, the liner layer LIN and the second insulating layer IL2 may disappear. For example, when the liner layer LIN includes poly-crystalline silicon or amorphous silicon, the poly-crystalline silicon or amorphous silicon may be oxidized in the etching process so as to be formed into silicon oxide.

The second device isolation layer ST2 may include a first protrusion OH1 and a second protrusion OH2 which protrude from its top surface. The first protrusion OH1 and the second protrusion OH2 may be formed from the liner layer LIN. In detail, the poly-crystalline silicon or amorphous silicon included in the liner layer LIN may be oxidized to form silicon oxide that has a purity higher than the respective purities of silicon oxides included in the first and second insulating layers IL1 and IL2. As a result, the silicon oxide formed from the liner layer LIN may have an etch resistance higher than the respective etch resistances of the first and second insulating layers IL1 and IL2. Thus portions of the liner layer LIN may remain to form the first protrusion OH1 and the second protrusion OH2.

For example, a distance L1 between the third active pattern AP3 and the first protrusion OH1 may be substantially equal to a distance L2 between the fourth active pattern AP4 and the second protrusion OH2.

Figure 3:
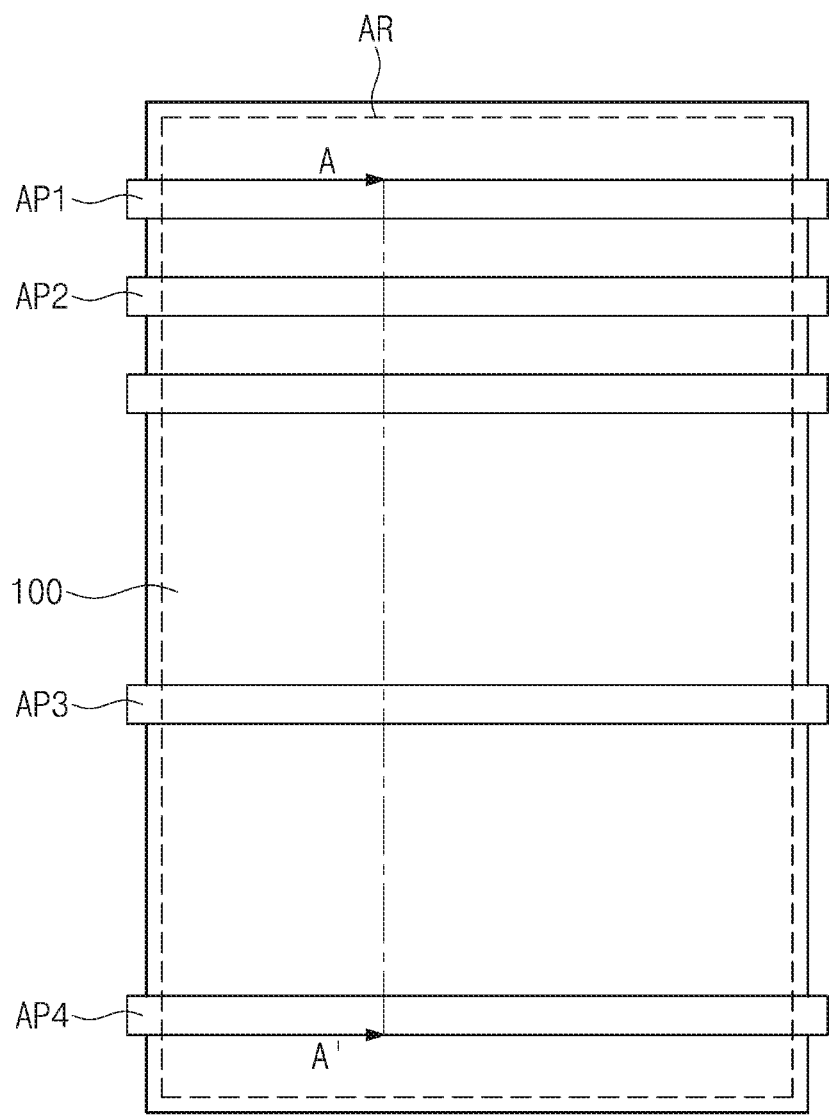
FIGS. 3 and 5 are plan views illustrating a method of manufacturing a semiconductor device, according to some embodiments of the inventive concepts.
Figure 4:
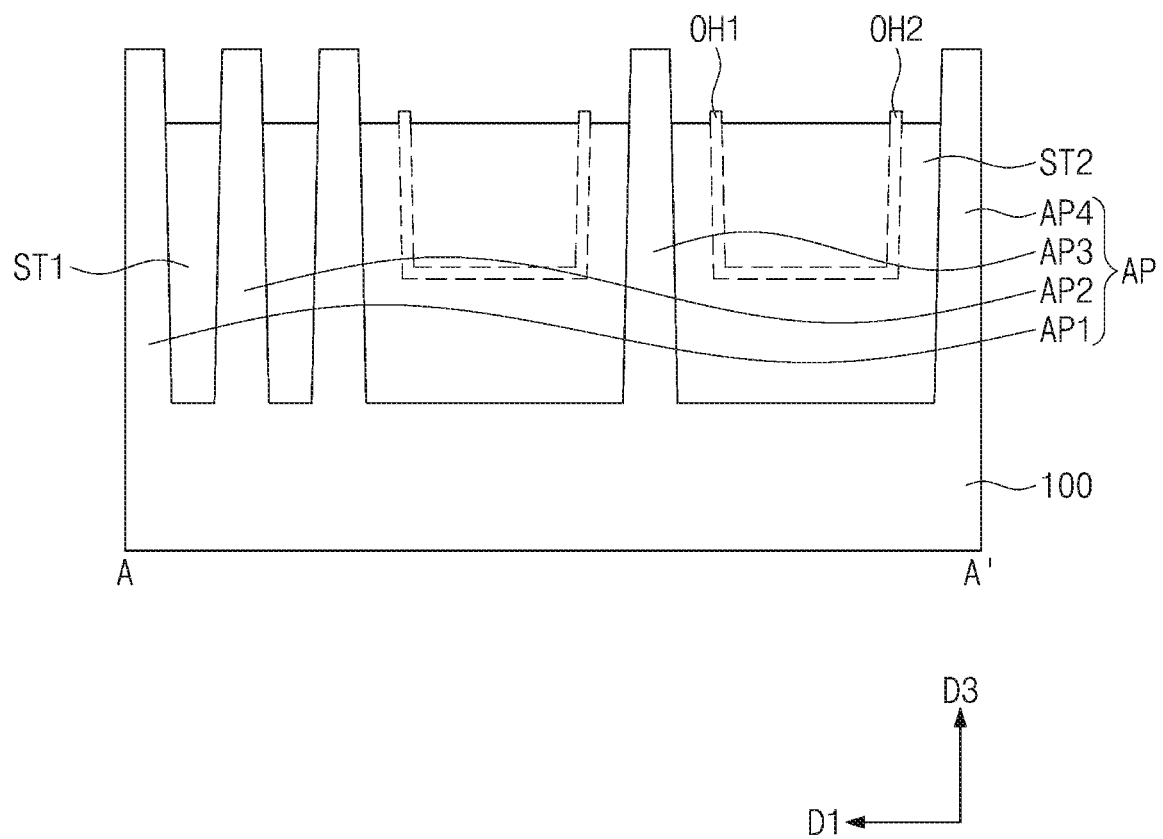
FIGS. 4 and 6A are cross-sectional views taken along lines A-A' of FIGS. 3 and 5, respectively.
Figure 5:
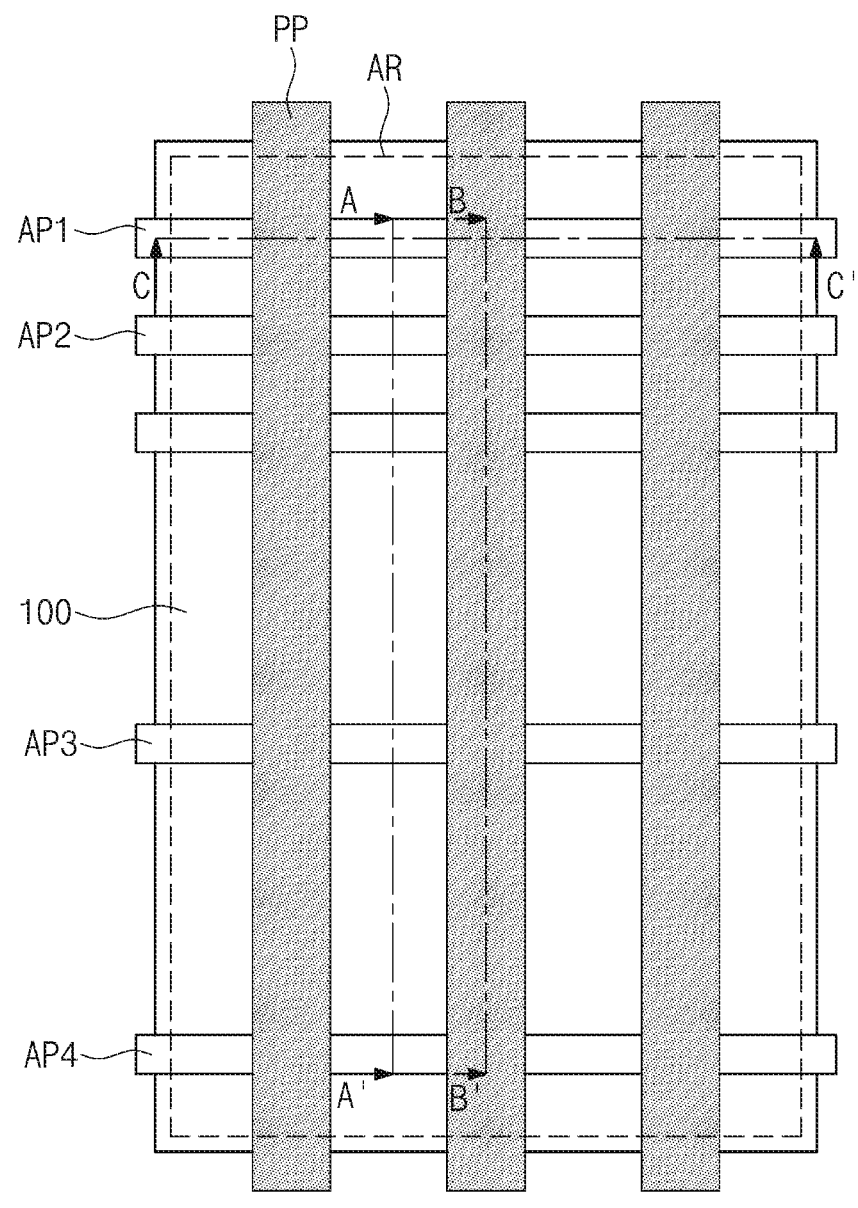
Figure 6A:
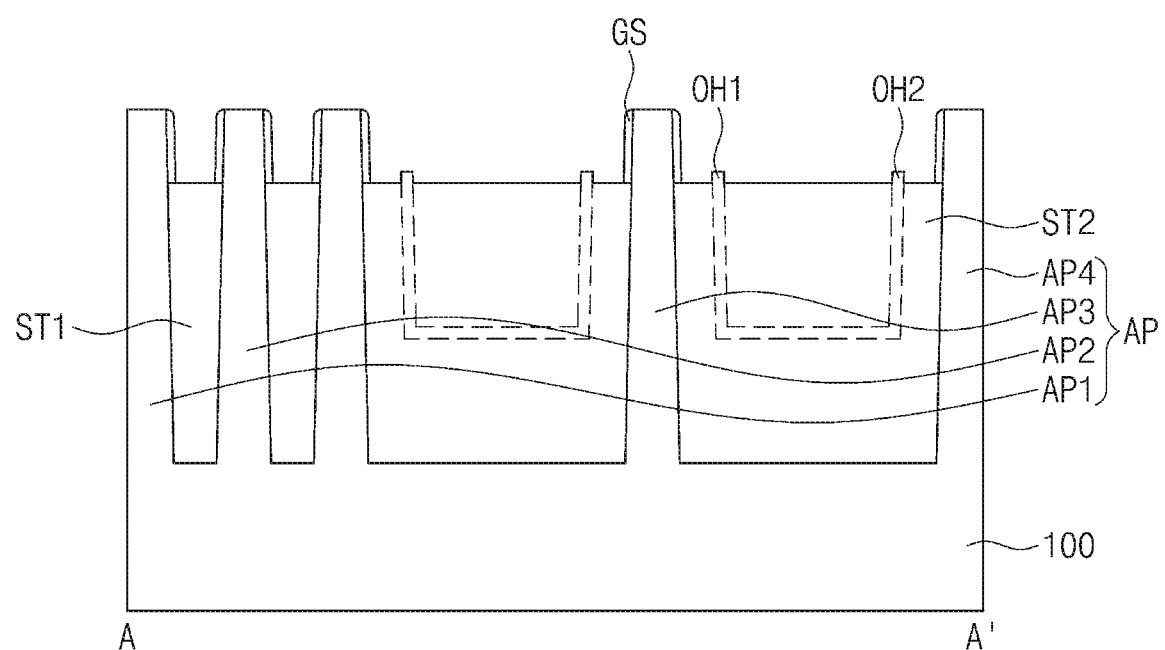
Figure 6A:
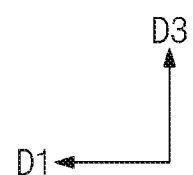
Figure 6B:
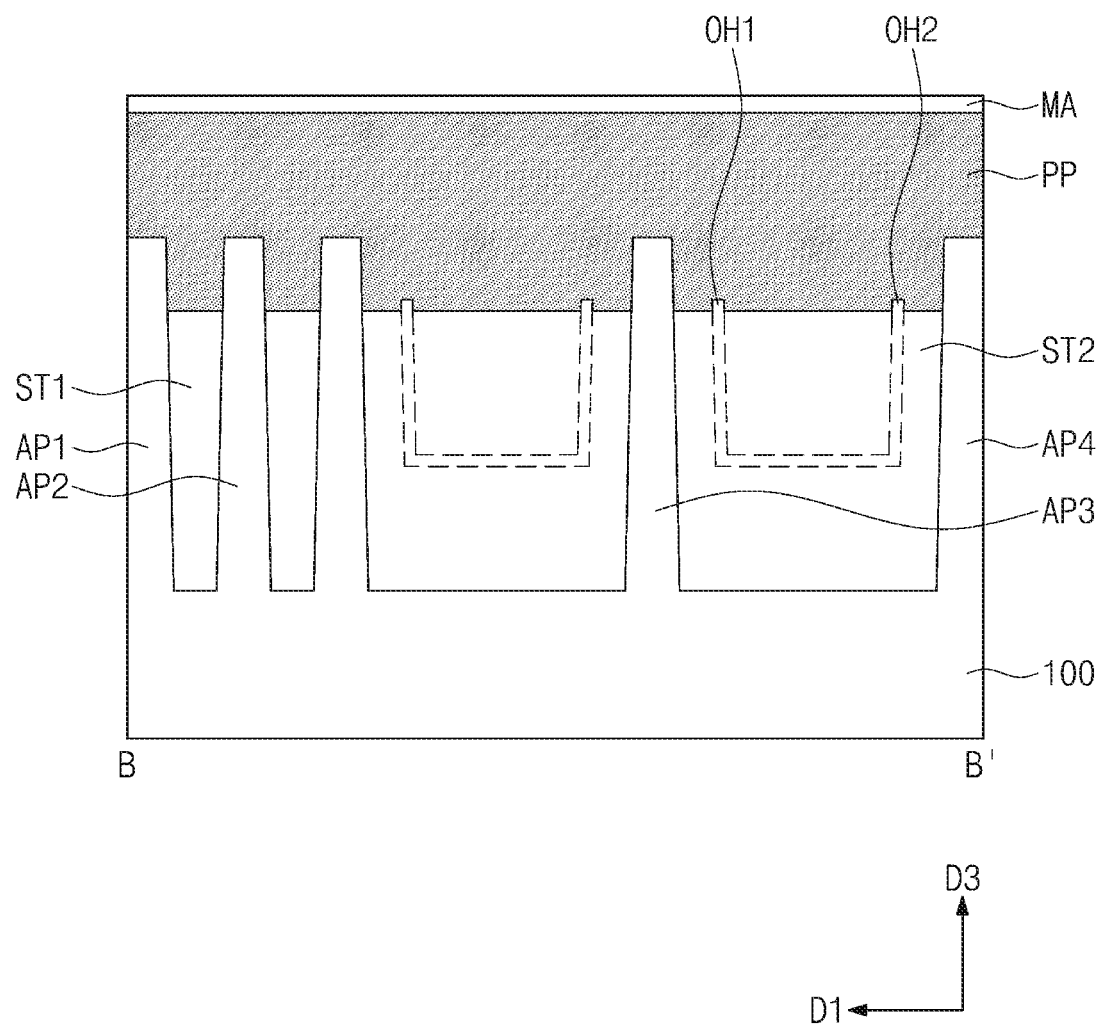
FIG. 6B is a cross-sectional view taken along a line B-B' of FIG. 5.
Figure 6C:
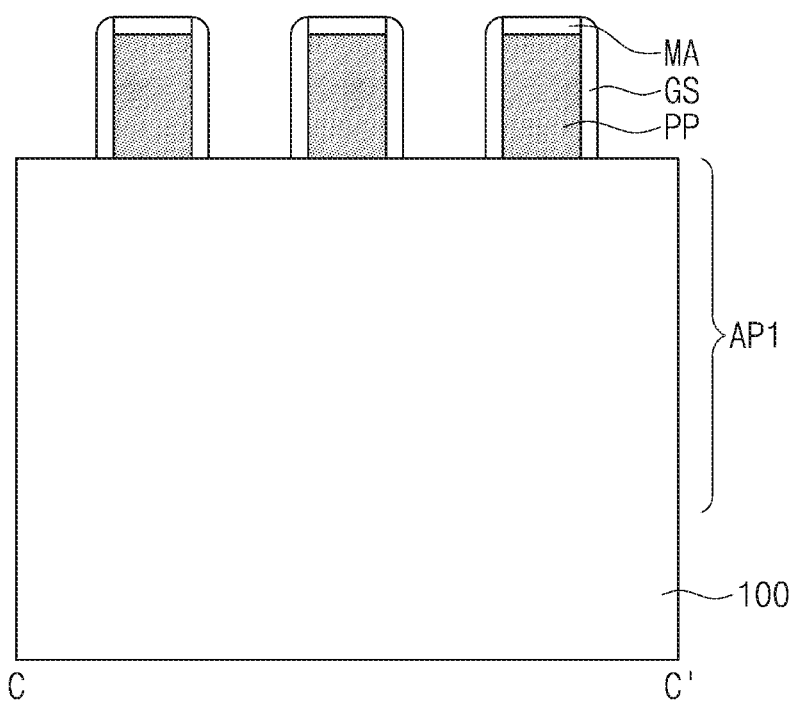
FIG. 6C is a cross-sectional view taken along a line C-C' of FIG. 5.

FIGS. 3 and 5 are plan views illustrating a method of manufacturing a semiconductor device, according to some embodiments of the inventive concepts. FIGS. 4 and 6A are cross-sectional views taken along lines A-A' of FIGS. 3 and 5, respectively. FIG. 6B is a cross-sectional view taken along a line B-B' of FIG. 5. FIG. 6C is a cross-sectional view taken along a line C-C' of FIG. 5. Hereinafter, the descriptions to the same technical features as mentioned with reference to FIGS. 1 and 2A to 2E may be omitted for the purpose of ease and convenience in explanation. In other words, differences between the embodiments of FIGS. 3, 4, 5, 6A, 6B, and 6C with the embodiments of FIGS. 1 and 2A to 2E will be mainly described.

Referring to FIGS. 3 and 4, a substrate 100 including an active region AR may be provided. The substrate 100 may be patterned to form first to fourth active patterns AP1, AP2, AP3 and AP4 on the active region AR. A first trench TR1 may be formed between the first active pattern AP1 and the second active pattern AP2 which are adjacent to each other, and a second trench TR2 may be formed between the third active pattern AP3 and the fourth active pattern AP4 which are adjacent to each other. A depth of the first trench TR1 may be substantially equal to a depth of the second trench TR2.

A first device isolation layer ST1 and a second device isolation layer ST2 may fill the first trench TR1 and the second trench TR2, respectively. The first device isolation layer ST1 and the second device isolation layer ST2 may be formed by the same method or a similar method as described above with reference to FIGS. 2A to 2E.

Referring to FIGS. 5 and 6A to 6C, sacrificial patterns PP may be formed to intersect the first to fourth active patterns AP1, AP2, AP3 and AP4. The sacrificial patterns PP may have line shapes or bar shapes, which extend in the first direction D1. For example, the formation of the sacrificial patterns PP may include forming a sacrificial layer on an entire top surface of the substrate 100, forming hard mask patterns MA on the sacrificial layer, and patterning the sacrificial layer using the hard mask patterns MA as etch masks. The sacrificial layer may include poly-crystalline silicon.

Gate spacers GS may be formed on sidewalls of each of the sacrificial patterns PP. The gate spacers GS may also be formed on sidewalls of each of the first to fourth active patterns AP1, AP2, AP3 and AP4. The sidewalls of each of the first to fourth active patterns AP1, AP2, AP3 and AP4 may not be covered or overlapped by the first and second device isolation layers ST1 and ST2 and the sacrificial patterns PP but may be exposed.

The formation of the gate spacers GS may include conformally forming a gate spacer layer on an entire top surface of the substrate 100 and anisotropically etching the gate spacer layer. For example, the gate spacer layer may include at least one of SiCN, SiCON, or SiN. In some embodiments, the gate spacer layer may be formed of a multi-layer including at least two of SiCN, SiCON, or SiN.

Figure 7:
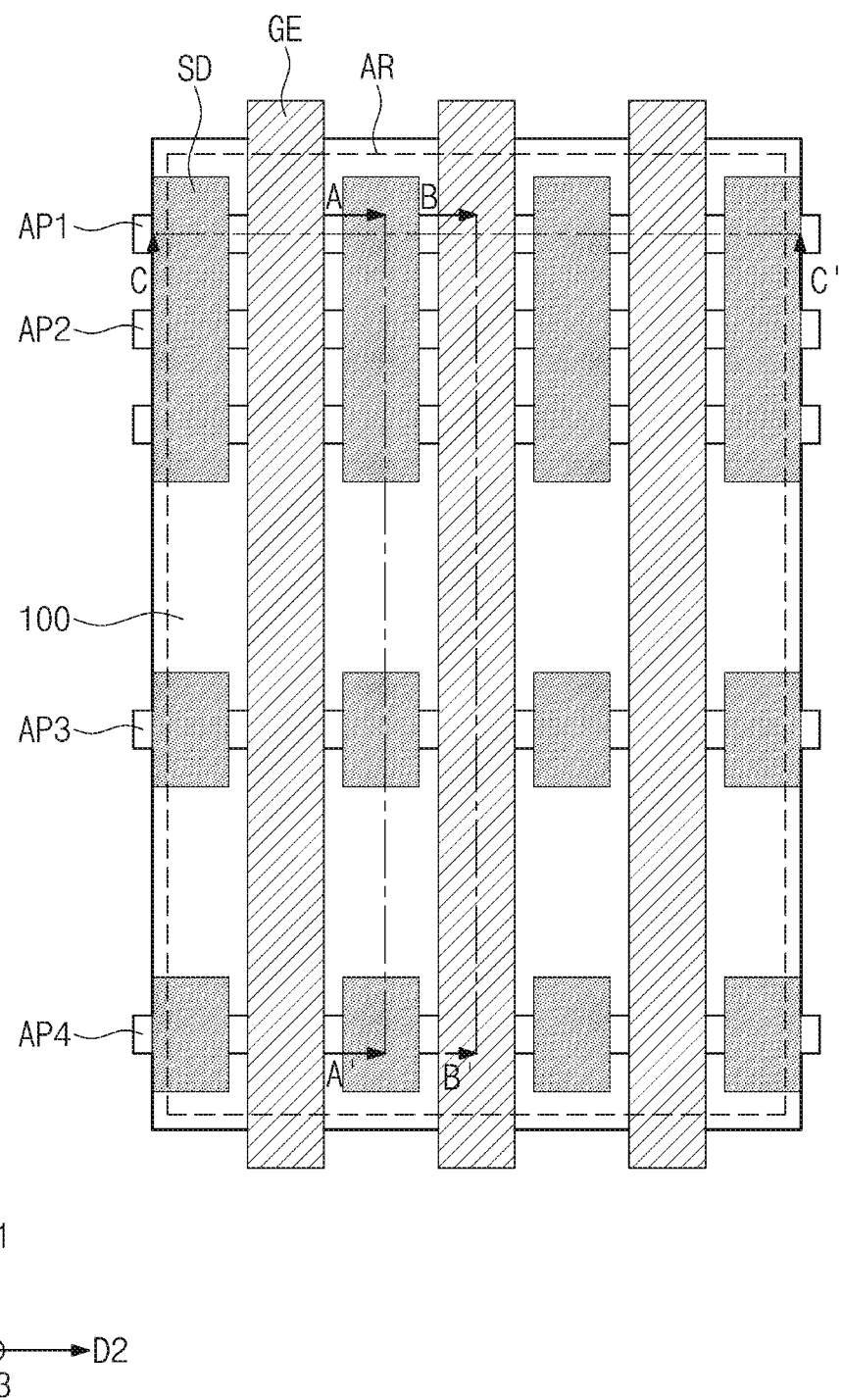
FIG. 7 is a plan view illustrating a semiconductor device according to some embodiments of the inventive concepts.
Figure 8A:
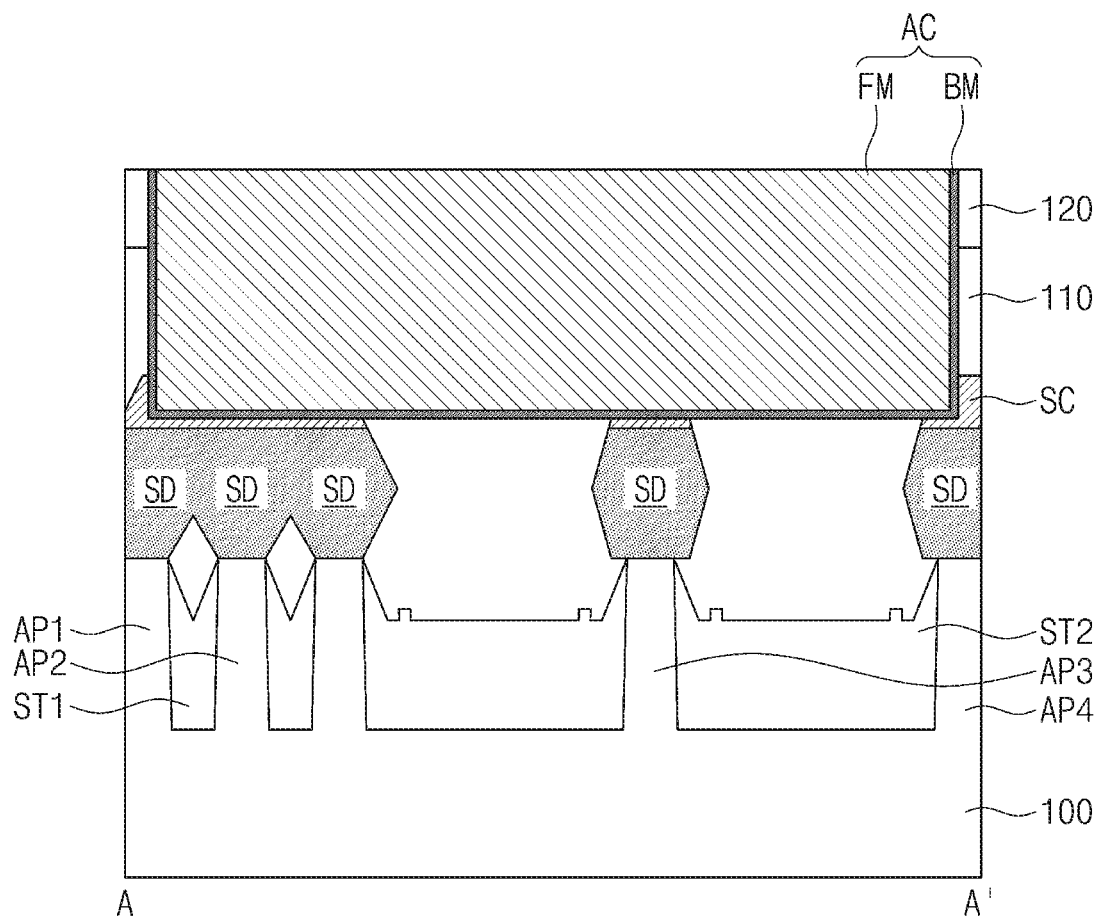
FIGS. 8A, 8B and 8C are cross-sectional views taken along lines A-A', B-B' and C-C' of FIG. 7, respectively.
Figure 8B:
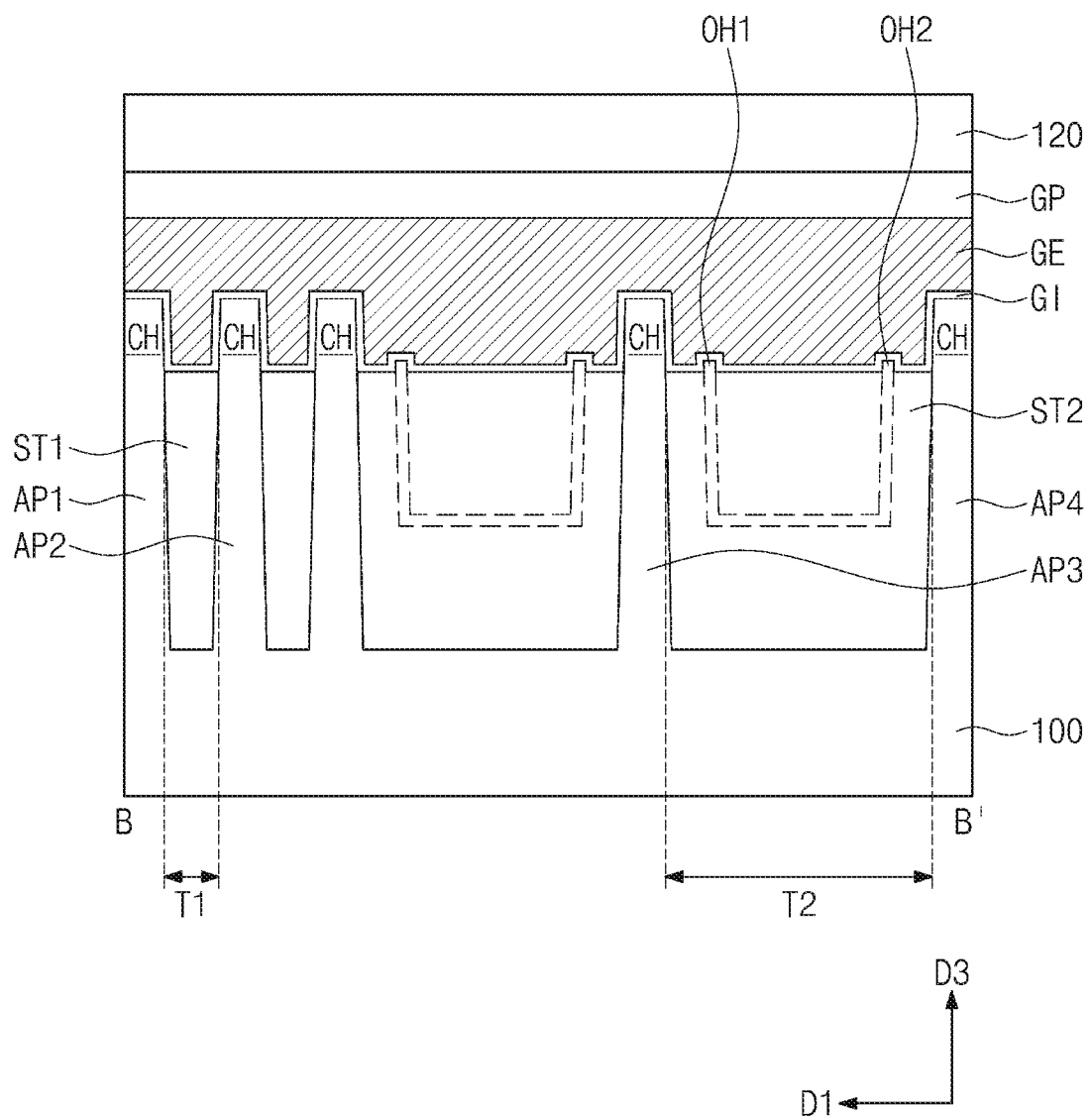
Figure 8C:
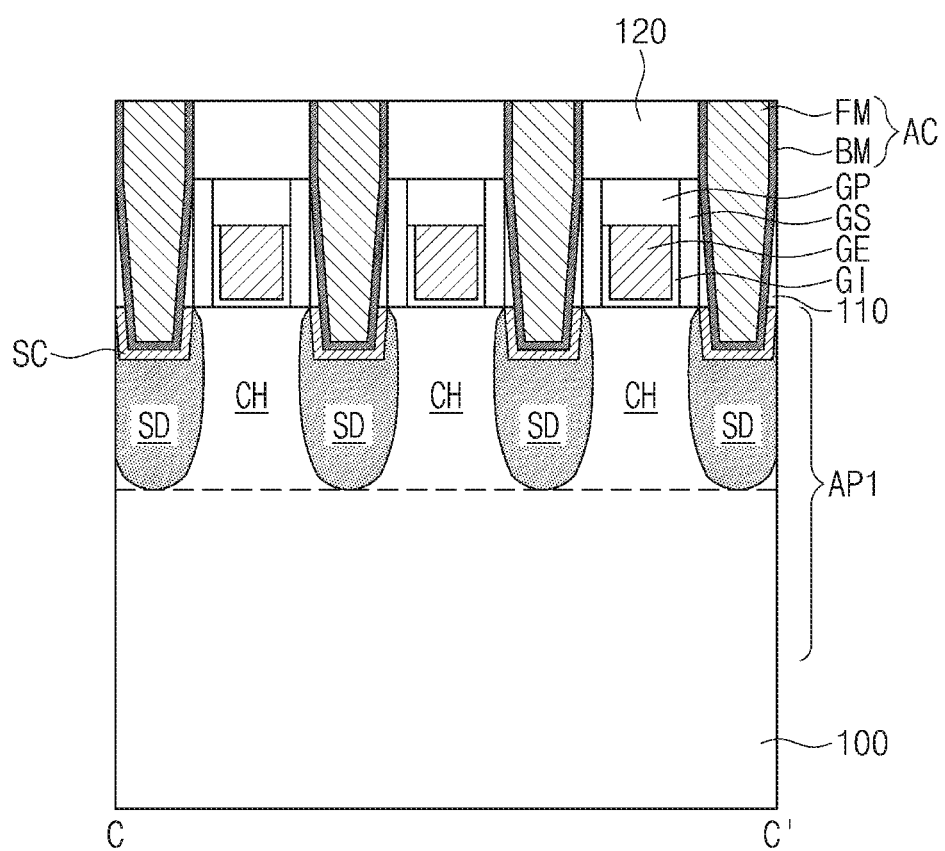
Figure 9A:
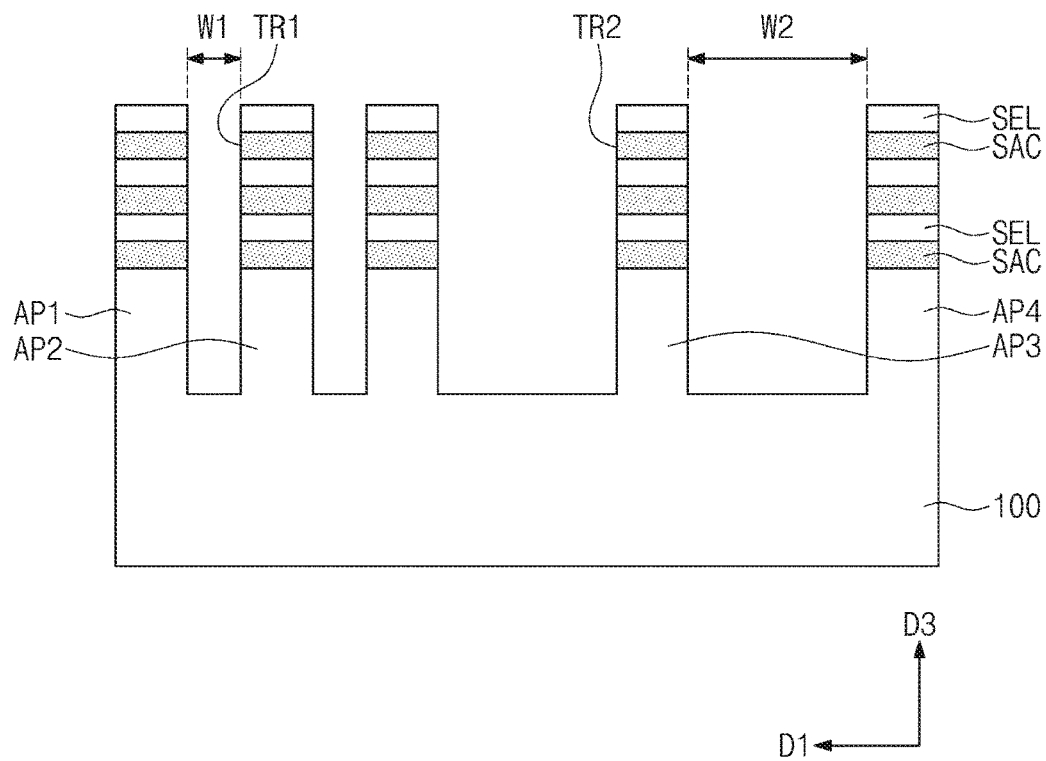
FIGS. 9A to 9E are cross-sectional views illustrating a method of manufacturing a semiconductor device, according to some embodiments of the inventive concepts.
Figure 9B:
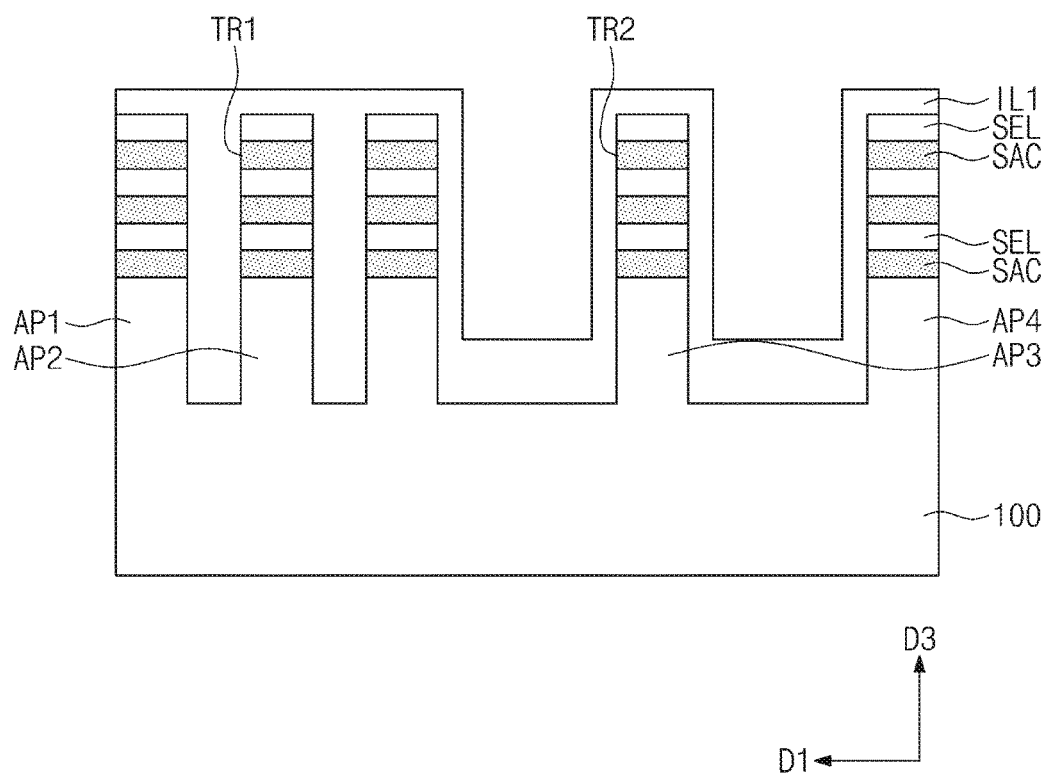
Figure 9C:
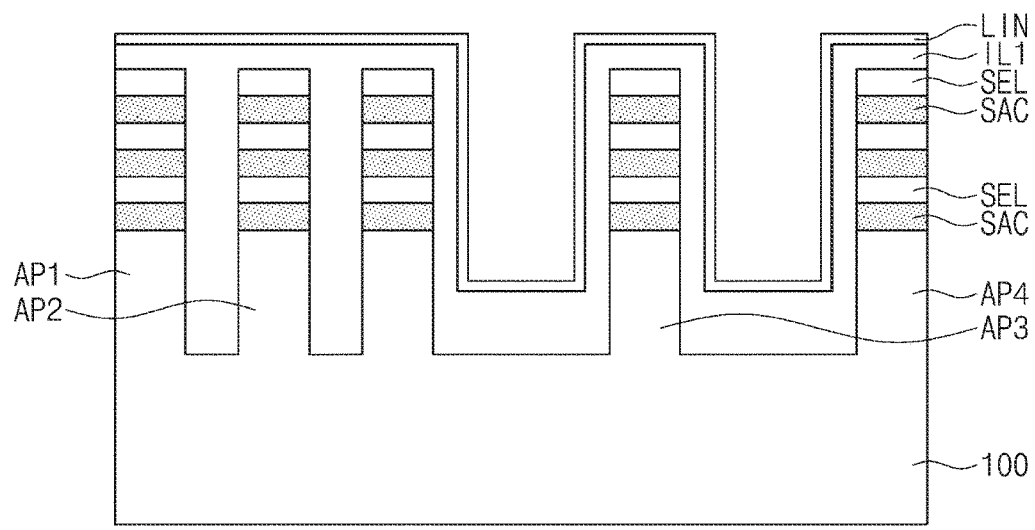
Figure 9D:
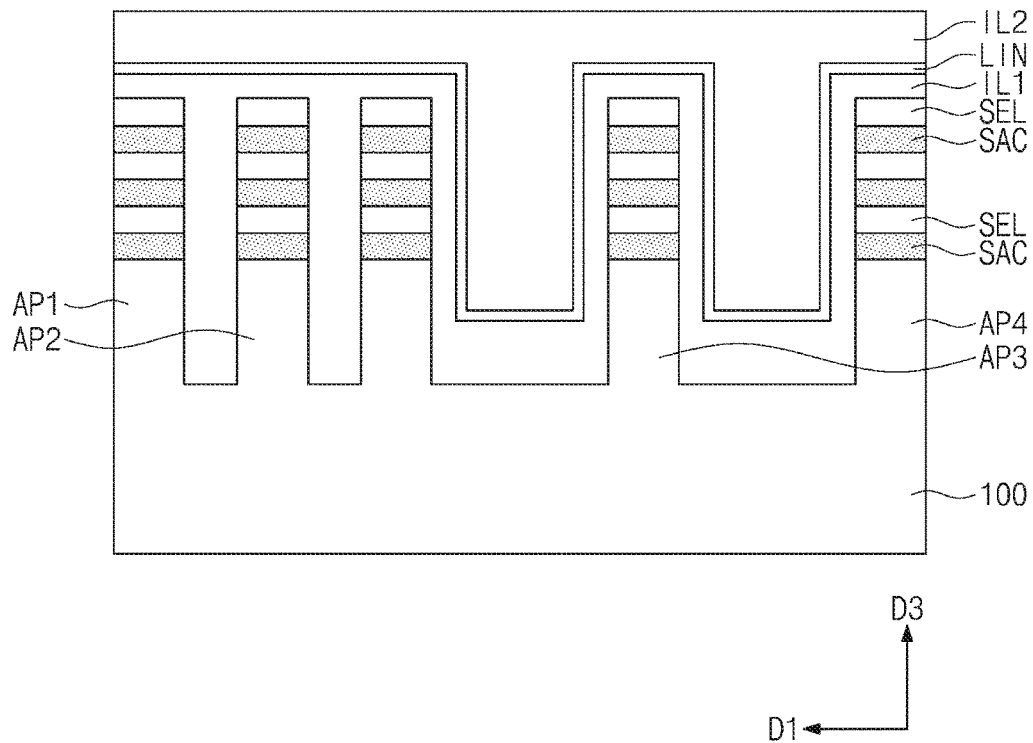
Figure 9E:
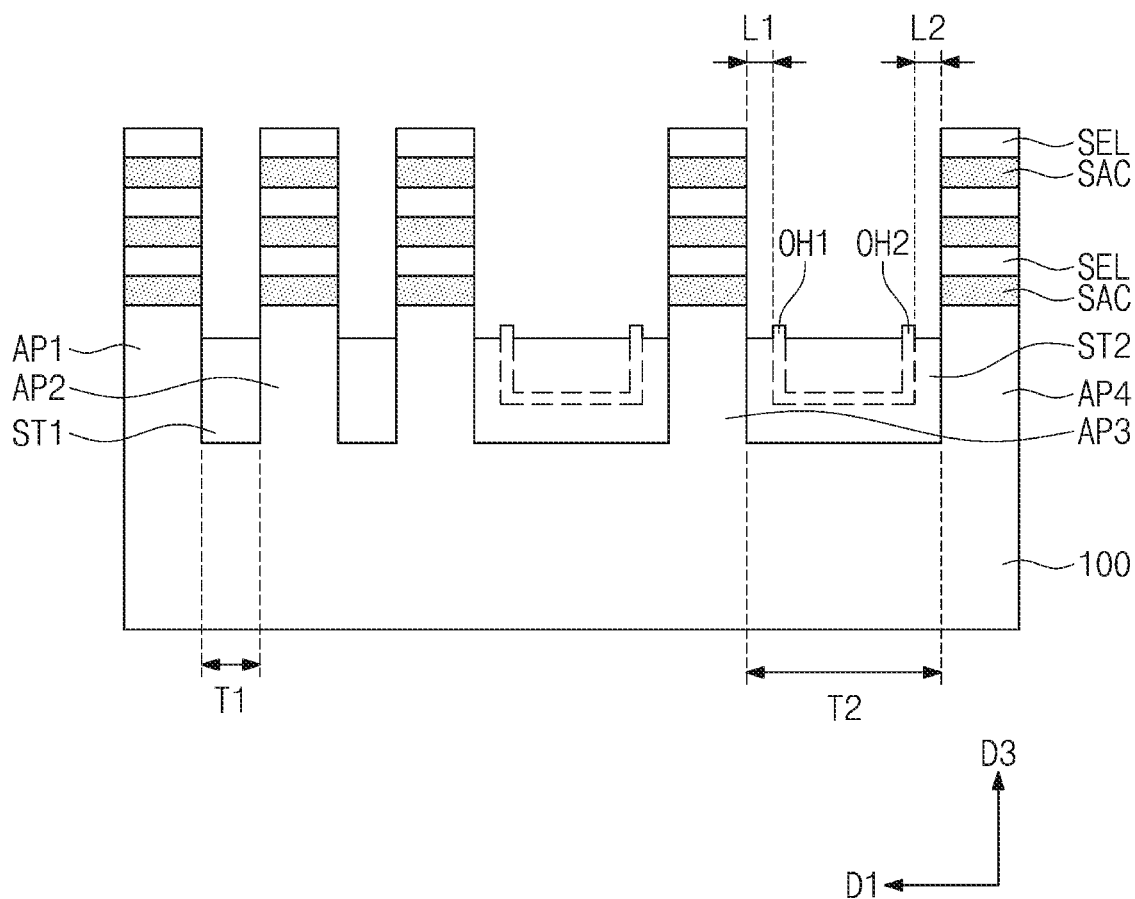

FIG. 7 is a plan view illustrating a semiconductor device according to some embodiments of the inventive concepts. FIGS. 8A, 8B and 8C are cross-sectional views taken along lines A-A', B-B' and C-C' of FIG. 7, respectively.

Referring to FIGS. 7 and 8A to 8C, a substrate 100 may include an active region AR. In some embodiments, the active region AR may be a PMOSFET region or an NMOSFET region.

First to fourth active patterns AP1, AP2, AP3 and AP4 may be provided on the active region AR. The first to fourth active patterns AP1, AP2, AP3 and AP4 may be formed by patterning the substrate 100. The first to fourth active patterns AP1, AP2, AP3 and AP4 may be portions of the substrate 100, which vertically protrude. The first to fourth active patterns AP1, AP2, AP3 and AP4 may extend in parallel to each other in a second direction D2. A first trench TR1 may be formed between the first active pattern AP1 and the second active pattern AP2 which are adjacent to each other, and a second trench TR2 may be formed between the third active pattern AP3 and the fourth active pattern AP4 which are adjacent to each other.

A first device isolation layer ST1 and a second device isolation layer ST2 may fill the first trench TR1 and the second trench TR2, respectively. The first device isolation layer ST1 and the second device isolation layer ST2 may be formed by the same method or a similar method as described above with reference to FIGS. 2A to 2E. A width T2 of the second device isolation layer ST2 may be greater than a width T1 of the first device isolation layer ST1. The second device isolation layer ST2 may include a first protrusion OH1 and a second protrusion OH2 which protrude from the top surface of the second device isolation layer ST2. For example, a distance L1 between the third active pattern AP3 and the first protrusion OH1 may be substantially equal to a distance L2 between the fourth active pattern AP4 and the second protrusion OH2.

Upper portions of the first to fourth active patterns AP1, AP2, AP3 and AP4 may vertically protrude upward from the first and second device isolation layers ST1 and ST2. Each of the upper portions of the first to fourth active patterns AP1, AP2, AP3 and AP4 may have a fin shape. The first and second device isolation layers ST1 and ST2 may not cover or overlap the upper portions of the first to fourth active patterns AP1, AP2, AP3 and AP4. The first and second device isolation layers ST1 and ST2 may cover, overlap, or be in contact with sidewalls of lower portions of the first to fourth active patterns AP1, AP2, AP3 and AP4.

Source/drain patterns SD may be provided in the upper portions of the first to fourth active patterns AP1, AP2, AP3 and AP4. The source/drain patterns SD may be P-type or N-type dopant regions. A channel pattern CH may be disposed between a pair of the source/drain patterns SD.

The source/drain patterns SD may include epitaxial patterns formed using a selective epitaxial growth (SEG) process. Upon formation of the source/drain patterns SD, the channel pattern CH may be defined between the source/drain patterns SD. For example, the SEG process may include a CVD process or a molecular beam epitaxy (MBE) process.

In some embodiments, top surfaces of the source/drain patterns SD may be substantially coplanar with top surfaces of the channel patterns CH. In some embodiments, the top surfaces of the source/drain patterns SD may be higher than the top surfaces of the channel patterns CH, with respect to the substrate.

The source/drain pattern SD may include a second semiconductor element for which a lattice constant is greater than that of a first semiconductor element of the substrate 100. For example, the first semiconductor element may be silicon (Si), and the second semiconductor element may be germanium (Ge). In some embodiments, the source/drain pattern SD may be formed of a plurality of stacked semiconductor layers. The formation of the source/drain patterns SD may include sequentially forming the semiconductor layers. For example, the semiconductor layers may include a buffer layer, a main layer, and a capping layer.

Gate electrodes GE may extend in the first direction D1 to intersect the first to fourth active patterns AP1, AP2, AP3 and AP4. The gate electrodes GE may be arranged in the second direction D2. The gate electrodes GE may vertically overlap with the channel patterns CH with respect to the third direction D3.

A pair of gate spacers GS may be disposed on both sidewalls of each of the gate electrodes GE, respectively. The gate spacers GS may extend along the gate electrodes GE in the first direction D1. Top surfaces of the gate spacers GS may be higher than top surfaces of the gate electrodes GE in the third direction D3, with respect to the substrate. The top surfaces of the gate spacers GS may be coplanar with a top surface of a first interlayer insulating layer 110 to be described later. The gate spacers GS may include at least one of SiCN, SiCON, or SiN. In some embodiments, each of the gate spacers GS may have a multi-layered structure formed of at least two of SiCN, SiCON, or SiN.

A gate capping pattern GP may be provided on each of the gate electrodes GE. The gate capping pattern GP may extend along the gate electrode GE in the first direction D1. The gate capping pattern GP may include a material having an etch selectivity with respect to first and second interlayer insulating layers 110 and 120 to be described later. For example, the gate capping pattern GP may include at least one of SiON, SiCN, SiCON, or SiN.

A gate dielectric pattern GI may be disposed between the gate electrode GE and the active patterns AP1 to AP4. The gate dielectric pattern GI may extend along a bottom surface of the gate electrode GE thereon. For example, the gate dielectric pattern GI may cover or overlap the top surface and sidewalls of the channel pattern CH. The gate dielectric pattern GI may cover or overlap top surfaces of the device isolation layers ST1 and ST2 under the gate electrode GE. The gate dielectric pattern GI may cover or overlap top surfaces of the first and second protrusions OH1 and OH2 on the second device isolation layer ST2.

In some embodiments, the gate dielectric pattern GI may include a high-k dielectric material of which a dielectric constant is higher than that of silicon oxide. For example, the high-k dielectric material may include at least one of hafnium oxide, hafnium-silicon oxide, hafnium-zirconium oxide, hafnium-tantalum oxide, lanthanum oxide, zirconium oxide, zirconium-silicon oxide, tantalum oxide, titanium oxide, barium-strontium-titanium oxide, barium-titanium oxide, strontium-titanium oxide, lithium oxide, aluminum oxide, lead-scandium-tantalum oxide, or lead-zinc niobate.

The gate electrode GE may include a first metal pattern and a second metal pattern on the first metal pattern. The first metal pattern may be provided on the gate dielectric pattern GI and may be adjacent to the channel patterns CH. The first metal pattern may include a work function metal for adjusting a threshold voltage of a transistor. A desired threshold voltage may be obtained by adjusting a thickness and/or a composition of the first metal pattern.

The first metal pattern may include a metal nitride layer. For example, the first metal pattern may include nitrogen (N) and at least one metal selected from a group consisting of titanium (Ti), tantalum (Ta), aluminum (Al), tungsten (W), and molybdenum (Mo). The first metal pattern may further include carbon (C). In some embodiments, the first metal pattern may include a plurality of stacked work function metal layers.

The second metal pattern may include a metal having a resistance lower than that of the first metal pattern. For example, the second metal pattern may include at least one metal selected from a group consisting of tungsten (W), aluminum (Al), titanium (Ti), and tantalum (Ta).

A first interlayer insulating layer 110 may be provided on the substrate 100. The first interlayer insulating layer 110 may cover, overlap, or be adjacent the gate spacers GS and the source/drain patterns SD. A top surface of the first interlayer insulating layer 110 may be substantially coplanar with top surfaces of the gate capping patterns GP and top surfaces of the gate spacers GS. A second interlayer insulating layer 120 may be provided on the first interlayer insulating layer 110 covering or overlapping the gate capping patterns GP.

Active contacts AC may penetrate the second and first interlayer insulating layers 120 and 110 so as to be electrically connected to the source/drain patterns SD. Each of the active contacts AC may be provided between a pair of the gate electrodes GE.

The active contact AC may be a self-aligned contact. In other words, the active contact AC may be formed to be self-aligned using the gate capping pattern GP and the gate spacer GS. For example, the active contact AC may cover, overlap, or be adjacent at least a portion of a sidewall of the gate spacer GS. Even though not shown in the drawings, the active contact AC may cover, overlap, or be adjacent a portion of the top surface of the gate capping pattern GP.

A silicide pattern SC may be disposed between the active contact AC and the source/drain pattern SD. The active contact AC may be electrically connected to the source/drain pattern SD through the silicide pattern SC. The silicide pattern SC may include a metal silicide and may include at least one of, for example, titanium silicide, tantalum silicide, tungsten silicide, nickel silicide, or a cobalt silicide.

The active contact AC may include a conductive pattern FM and a barrier pattern BM surrounding the conductive pattern FM. For example, the conductive pattern FM may include at least one metal of aluminum, copper, tungsten, molybdenum, or cobalt. The barrier pattern BM may cover, overlap, or be adjacent a bottom surface and sidewalls of the conductive pattern FM. The barrier pattern BM may include a metal layer/a metal nitride layer. The metal layer may include at least one of titanium, tantalum, tungsten, nickel, cobalt, or platinum. The metal nitride layer may include at least one of titanium nitride (TiN), tantalum nitride (TaN), tungsten nitride (WN), nickel nitride (NiN), cobalt nitride (CoN), or platinum nitride (PtN).

Referring again to FIG. 8B, the gate electrode GE may surround the top surface and both sidewalls of each of the channel patterns CH. In other words, the transistor according to the present embodiment may be a three-dimensional (3D) field effect transistor (e.g., FinFET) in which the gate electrode GE three-dimensionally surrounds the channel pattern CH.

FIGS. 9A to 9E are cross-sectional views illustrating a method of manufacturing a semiconductor device, according to some embodiments of the inventive concepts. Hereinafter, the descriptions to the same technical features as mentioned with reference to FIGS. 1 and 2A to 2E will be omitted for the purpose of ease and convenience in explanation. In other words, differences between the present embodiments and the embodiments of FIGS. 1 and 2A to 2E will be mainly described.

Referring to FIGS. 9A to 9E, sacrificial layers SAC and semiconductor layers SEL may be alternately and repeatedly stacked on an entire top surface of a substrate 100. Three semiconductor layers SEL are stacked in FIG. 9A. However, embodiments of the inventive concepts are not limited thereto. In some embodiments, the sacrificial layers SAC may include a material having an etch selectivity with respect to the semiconductor layers SEL. In other words, the semiconductor layers SEL may include a material which may not be etched in a process of etching the sacrificial layers SAC. For example, the sacrificial layers SAC may include silicon-germanium (SiGe) or germanium (Ge), and the semiconductor layers SEL may include silicon (Si).

The sacrificial layers SAC, the semiconductor layers SEL and the substrate 100 may be patterned to form first to fourth active patterns AP1, AP2, AP3 and AP4. A first trench TR1 may be formed between the first active pattern AP1 and the second active pattern AP2, and a second trench TR2 may be formed between the third active pattern AP3 and the fourth active pattern AP4. As described above with reference to FIGS. 2A to 2E, the first insulating layer IL1, the liner layer LIN and the second insulating layer IL2 may be sequentially deposited on the first trench TR1 and the second trench TR2, and the deposited layers IL1, LIN and IL2 may be etched to form a first device isolation layer ST1 and a second device isolation layer ST2.

FIGS. 10, 12, 14 and 16 are plan views illustrating a method of manufacturing a semiconductor device, according to some embodiments of the inventive concepts. FIGS. 11A, 13A, 15A and 17A are cross-sectional views taken along lines A-A' of FIGS. 10, 12, 14 and 16, respectively. FIGS.

Figure 13A:
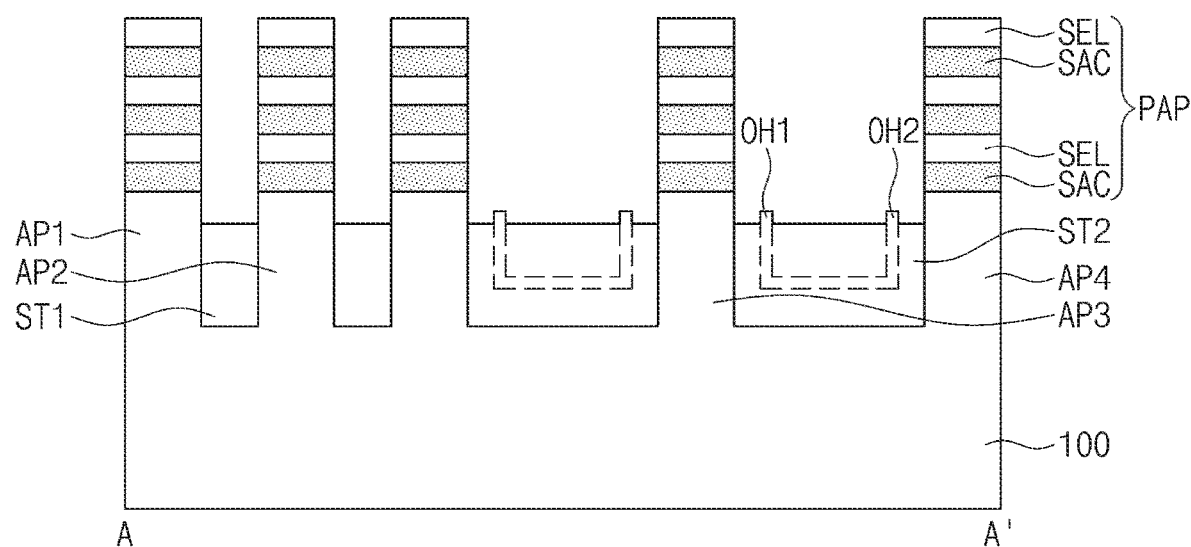
Figure 13B:
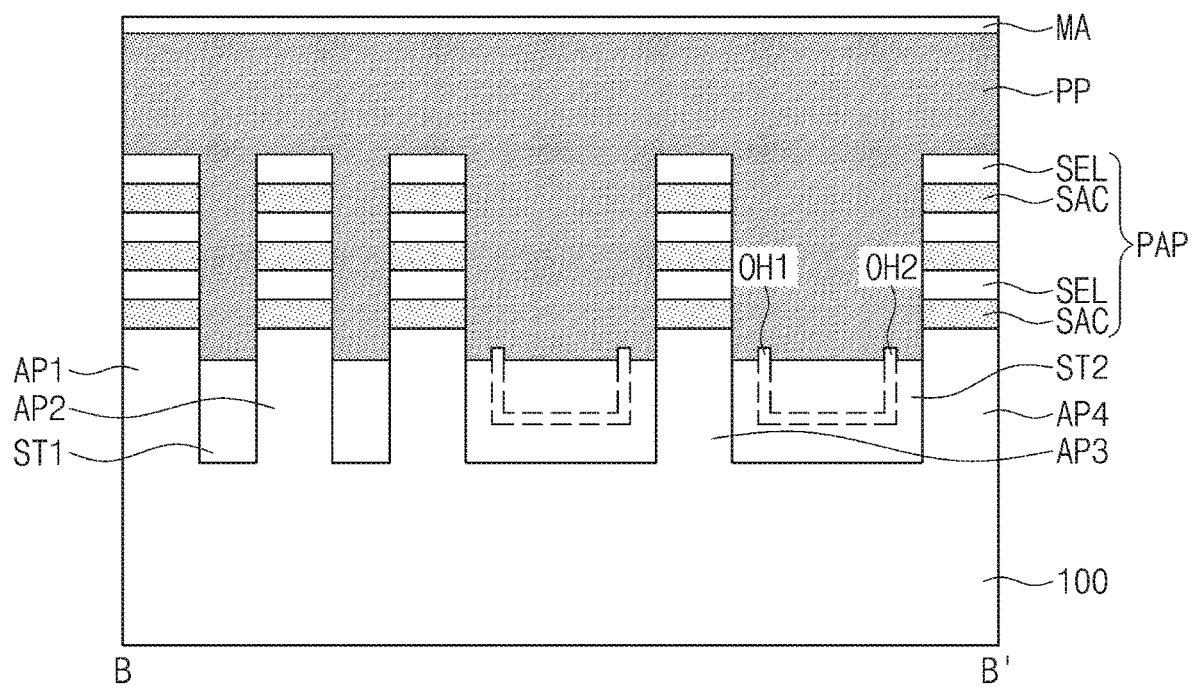
Figure 13C:
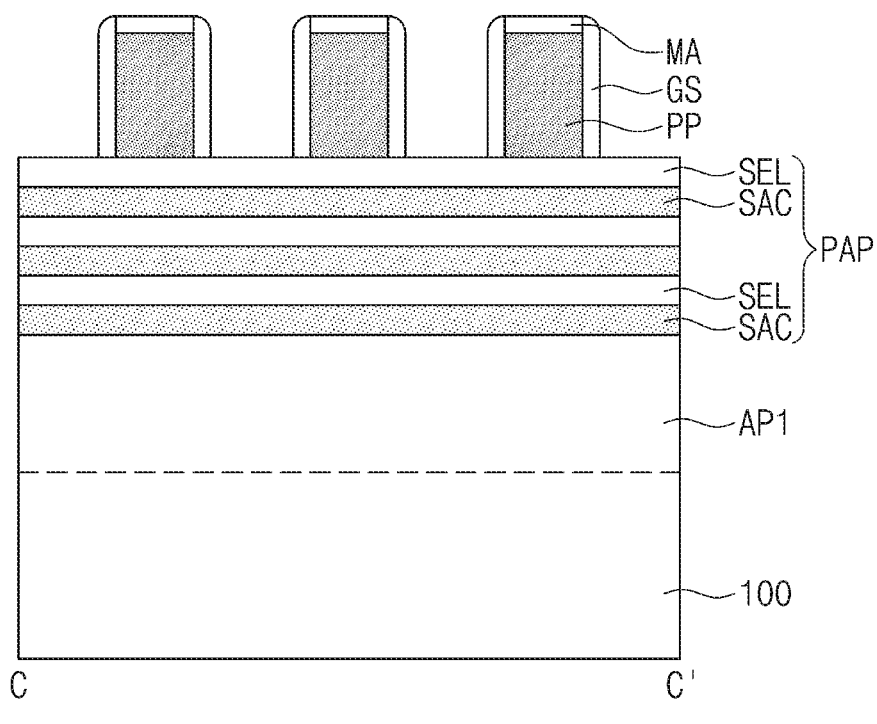
FIGS. 13C, 15C and 17C are cross-sectional views taken along lines C-C' of FIGS. 12, 14 and 16, respectively.
Figure 13C:
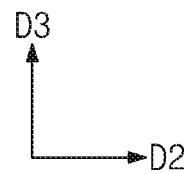
Figure 14:
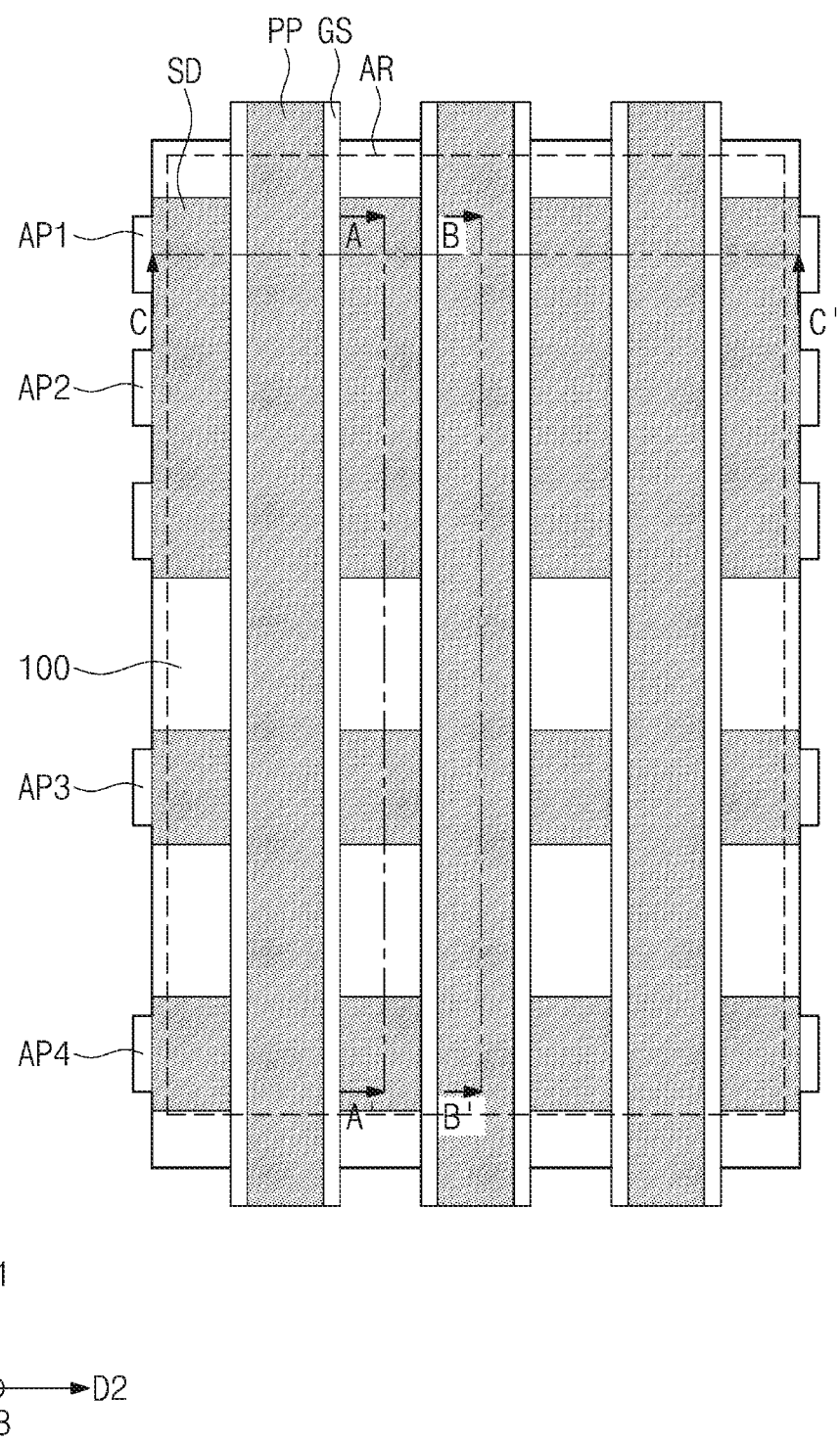
Figure 15A:
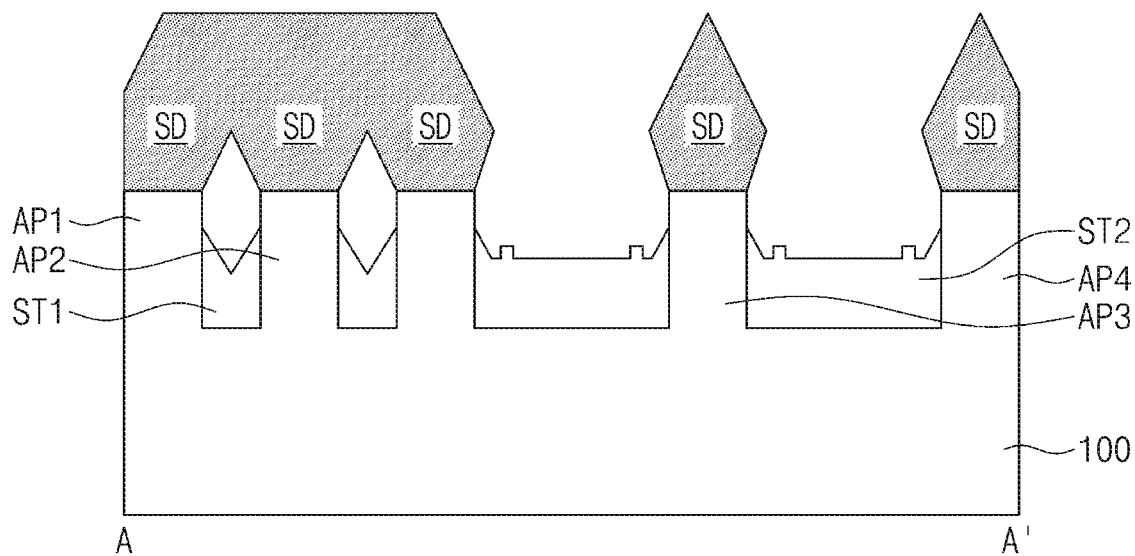
Figure 15B:
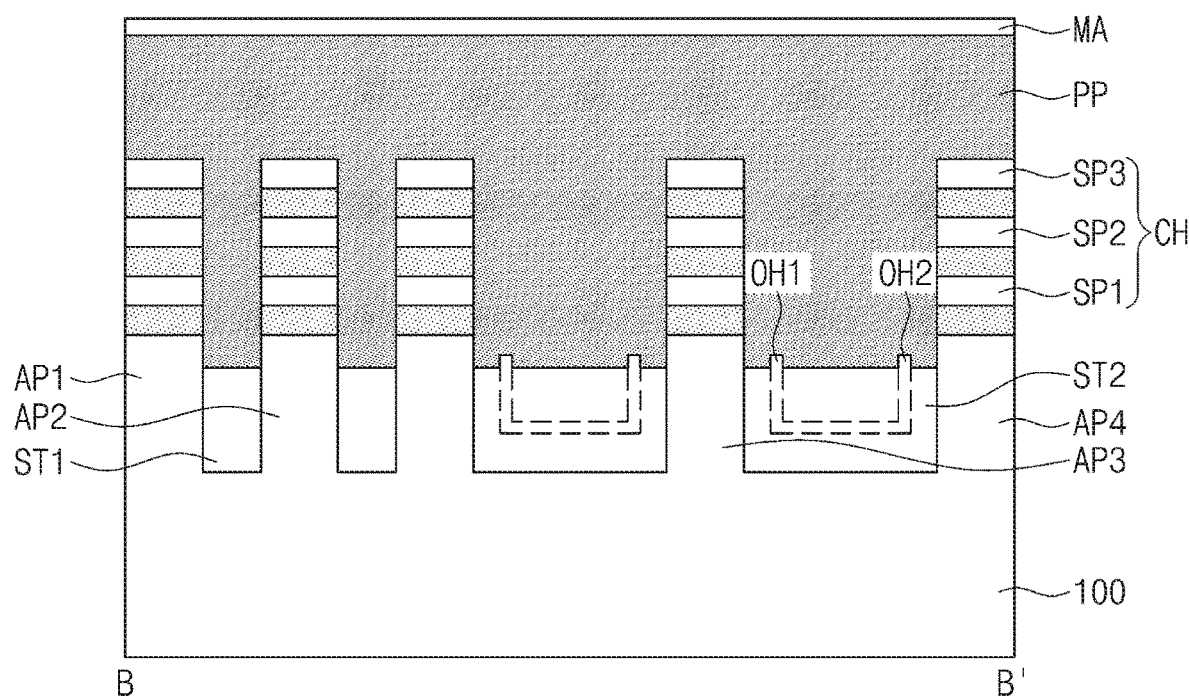
Figure 15C:
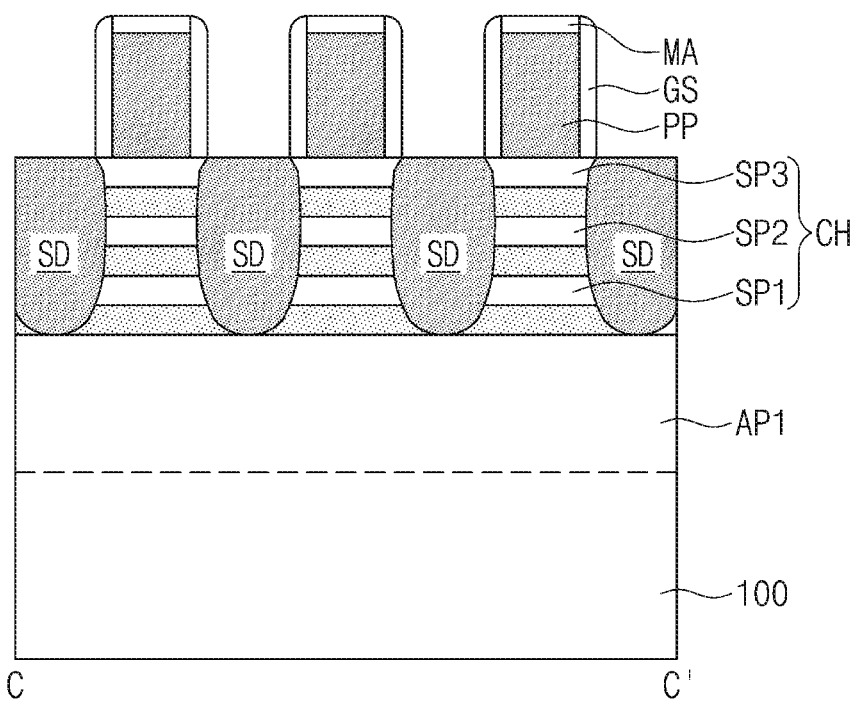
Figure 16:
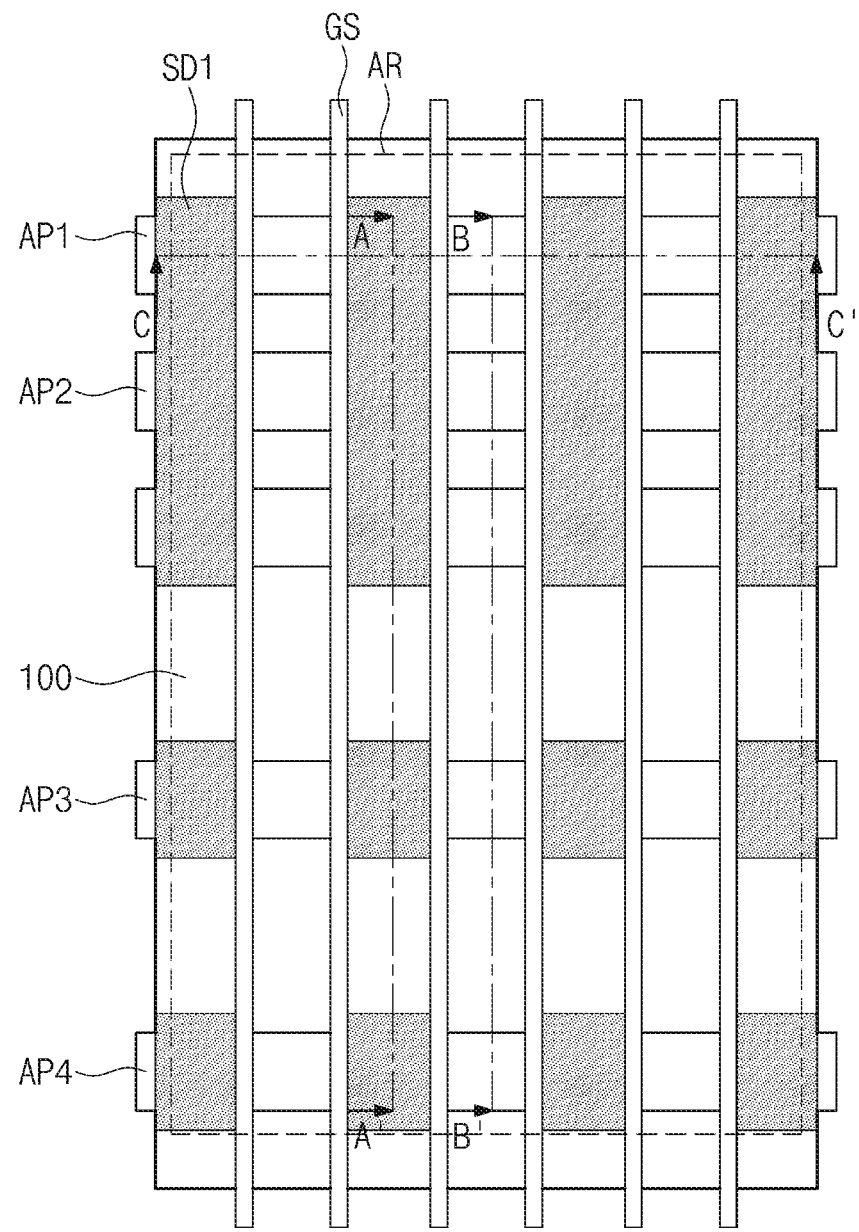
Figure 17A:
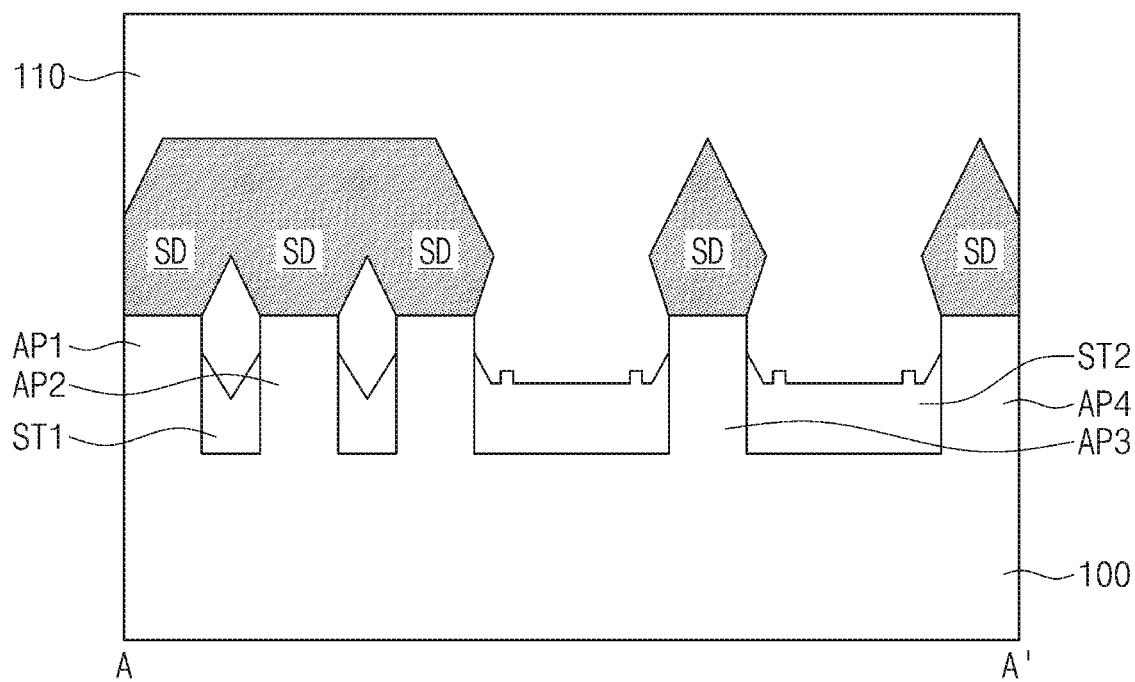
Figure 17B:
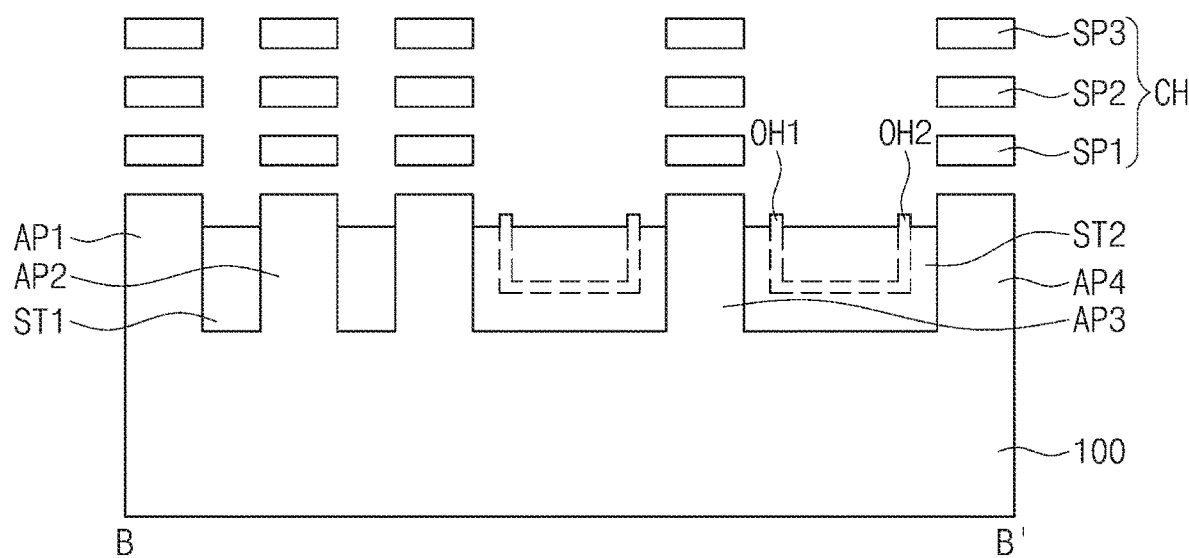
Figure 17B:
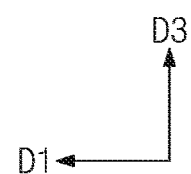
Figure 17C:
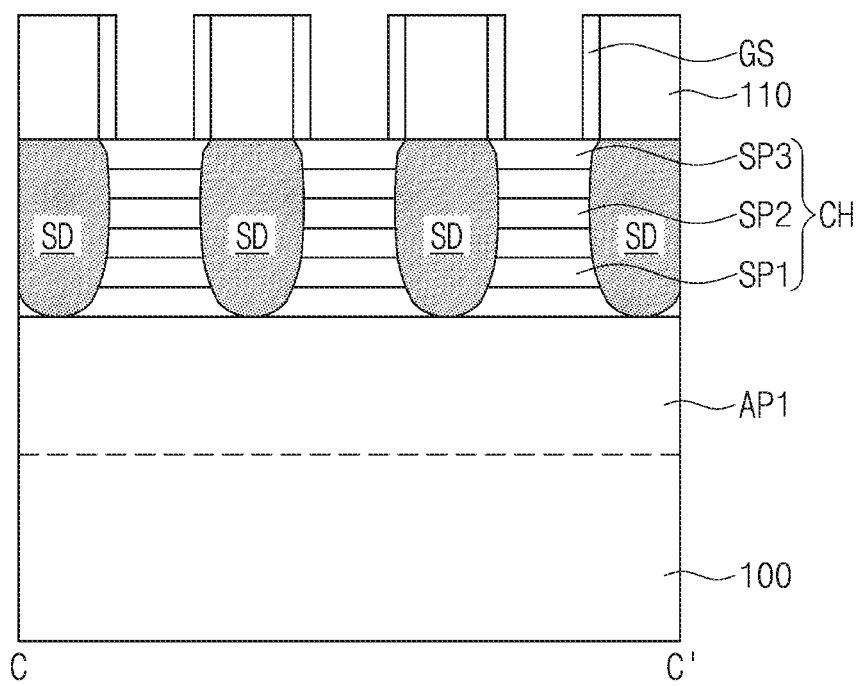

11B, 13B, 15B and 17B are cross-sectional views taken along lines B-B' of FIGS. 10, 12, 14 and 16, respectively. FIGS. 13C, 15C and 17C are cross-sectional views taken along lines C-C' of FIGS. 12, 14 and 16, respectively. Hereinafter, the descriptions to the same technical features as mentioned with reference to FIGS. 3 to 9E will be omitted for the purpose of ease and convenience in explanation. In other words, differences between the present embodiments and the embodiments of FIGS. 3 to 9E will be mainly described.

Figure 10:
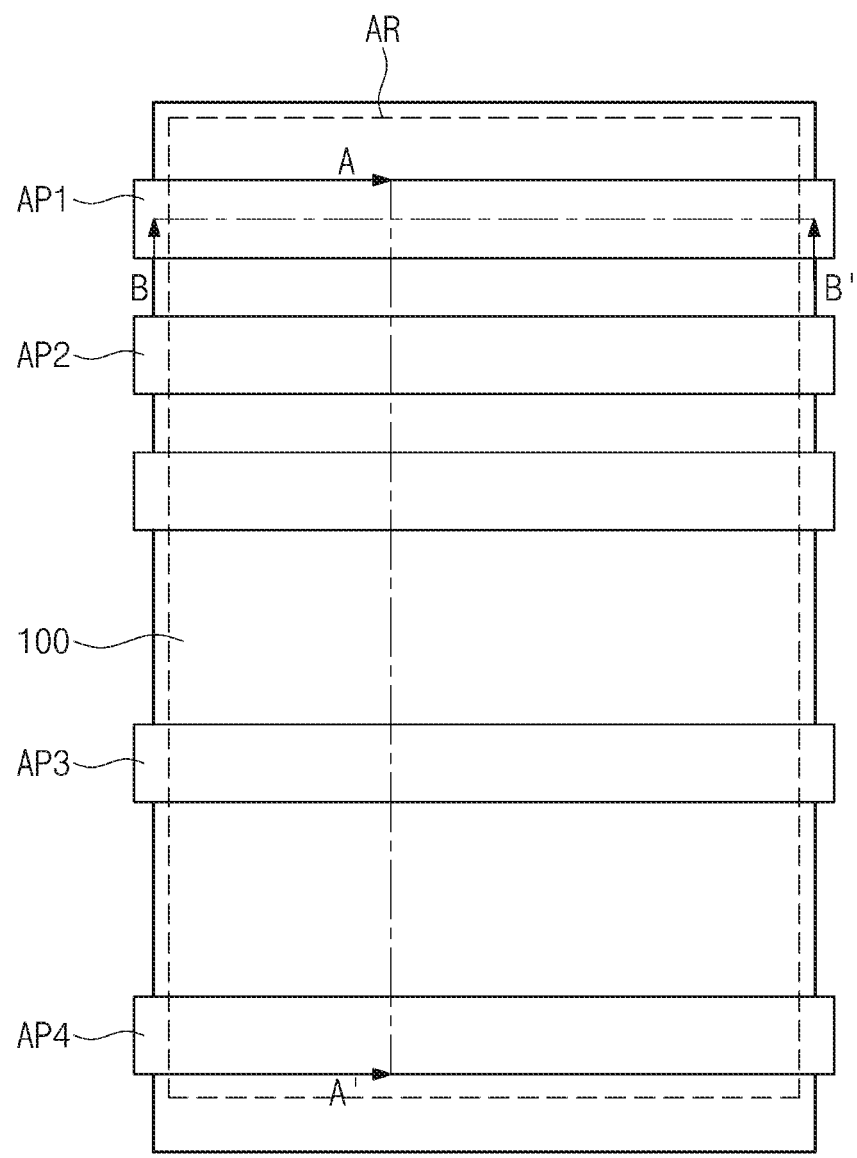
FIGS. 10, 12, 14 and 16 are plan views illustrating a method of manufacturing a semiconductor device, according to some embodiments of the inventive concepts.
Figure 11A:
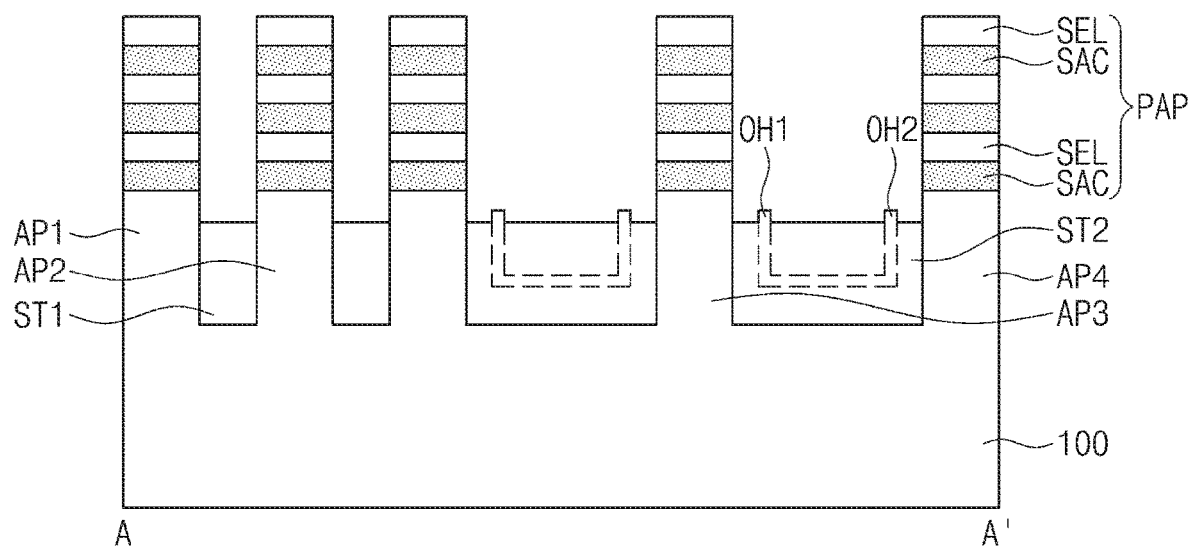
FIGS. 11A, 13A, 15A and 17A are cross-sectional views taken along lines A-A' of FIGS. 10, 12, 14 and 16, respectively.
Figure 11A:
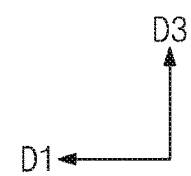
Figure 11B:
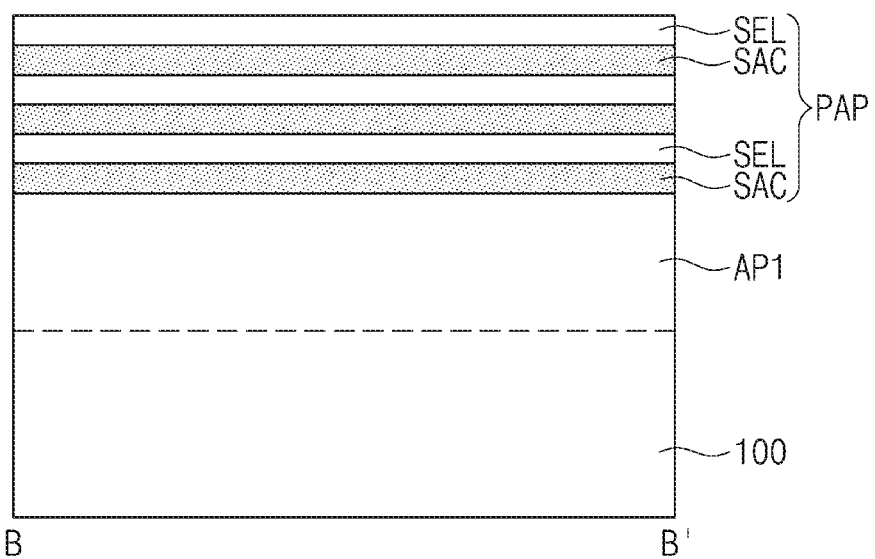
FIGS. 11B, 13B, 15B and 17B are cross-sectional views taken along lines B-B' of FIGS. 10, 12, 14 and 16, respectively.
Figure 11B:
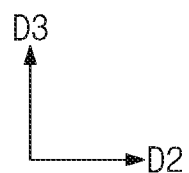
Figure 12:
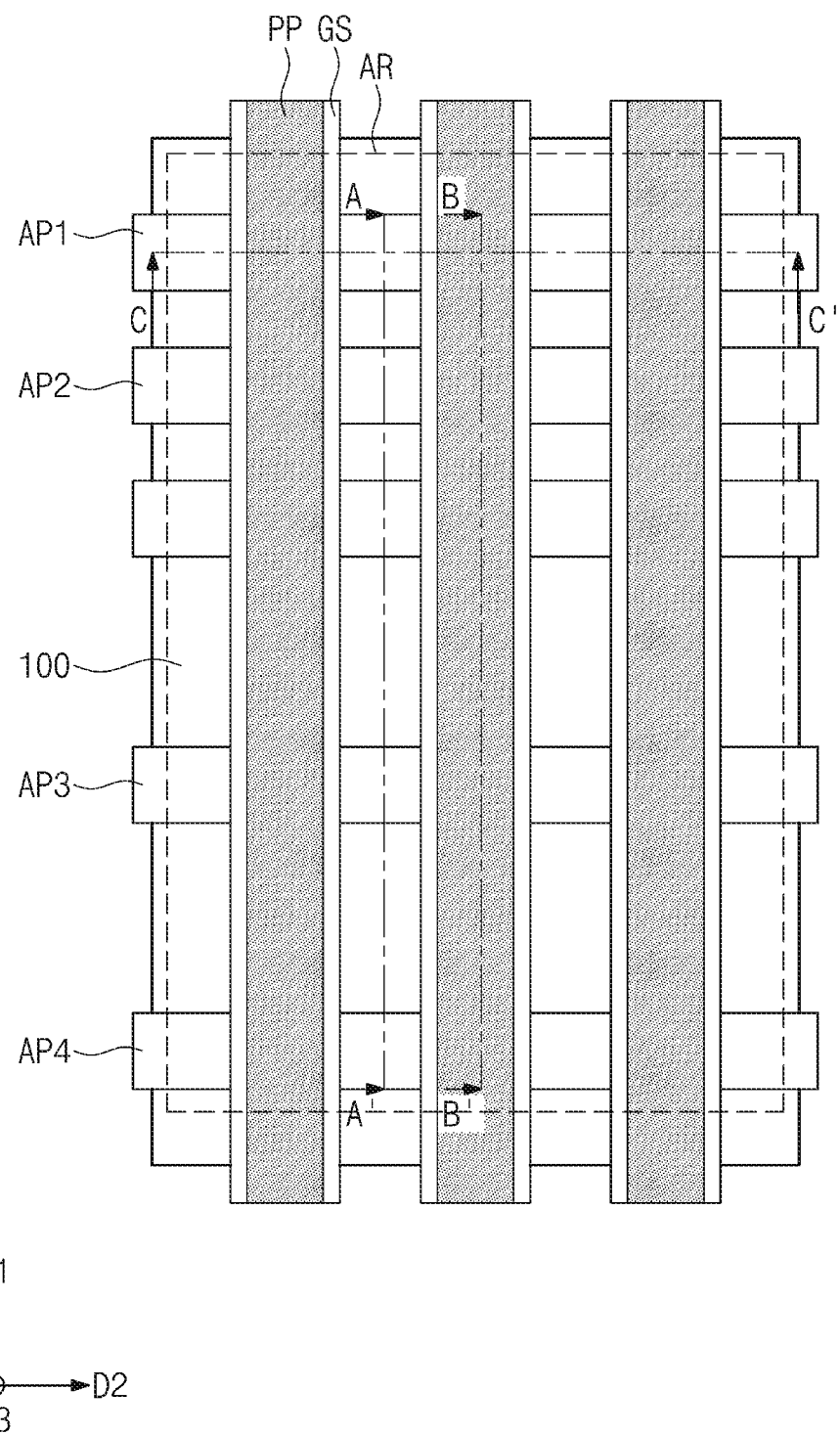

Referring to FIGS. 10, 11A and 11B, preliminary patterns PAP may be formed on an active region AR of a substrate 100 by patterning sacrificial layers SAC and semiconductor layers SEL which are alternately and repeatedly stacked on the substrate 100. In the patterning process, an upper portion of the substrate 100 may be etched to form a first trench TR1 and a second trench TR2 which define first to fourth active patterns AP1, AP2, AP3 and AP4.

The preliminary patterns PAP may be disposed on the active patterns AP1 to AP4, respectively. The preliminary patterns PAP may vertically overlap, in a direction perpendicular to the substrate, with the active patterns AP1 to AP4, respectively. In other words, a planar shape of each of the preliminary patterns PAP may be substantially the same as a planar shape of a corresponding one of the active patterns AP1 to AP4. The preliminary patterns PAP and the active patterns AP1 to AP4 may have line shapes or bar shapes, which extend in the second direction D2.

Referring to FIGS. 12 and 13A to 13C, sacrificial patterns PP may be formed to intersect the preliminary patterns PAP. Each of the sacrificial patterns PP may have a line shape or bar shape extending in the first direction D1. The sacrificial patterns PP may be formed using mask patterns MA thereon as etch masks. A pair of gate spacers GS may be formed on both sidewalls of each of the sacrificial patterns PP, respectively.

Referring to FIGS. 14 and 15A to 15C, the preliminary patterns PAP may be etched using the mask patterns MA and the gate spacers GS as etch masks, thereby forming channel patterns CH. The semiconductor layers SEL of the preliminary pattern PAP may be patterned to form first to third semiconductor patterns SP1, SP2 and SP3. The channel pattern CH may include the first to third semiconductor patterns SP1, SP2 and SP3.

In addition, a pair of recesses may be respectively formed at both sides of the channel pattern CH by the etching of the preliminary pattern PAP. Source/drain patterns SD may be formed to fill the recesses. The formation of the source/drain patterns SD may include performing a selective epitaxial growth (SEG) process using the active patterns AP1 to AP4 and the first to third semiconductor patterns SP1, SP2 and SP3 as a seed layer.

Referring to FIGS. 16 and 17A to 17C, a first interlayer insulating layer 110 may be formed on the substrate 100. Next, a planarization process may be performed on the first interlayer insulating layer 110 until top surfaces of the sacrificial patterns PP are exposed.

The sacrificial patterns PP exposed by the planarization process may be selectively removed. An empty space may be formed between the pair of gate spacers GS adjacent to each other by the removal of the sacrificial pattern PP. The empty space may expose the first to third semiconductor patterns SP1, SP2 and SP3 and the sacrificial layers SAC.

The sacrificial layers SAC exposed by the empty space may be selectively removed. For example, when the sacrificial layers SAC includes silicon-germanium (SiGe) and the first to third semiconductor patterns SP1, SP2 and SP3 includes silicon (Si), the selective etching process may be performed using an etching solution including peracetic acid. The etching solution may further include a hydrofluoric acid (HF) aqueous solution and deionized water.

Figure 18:
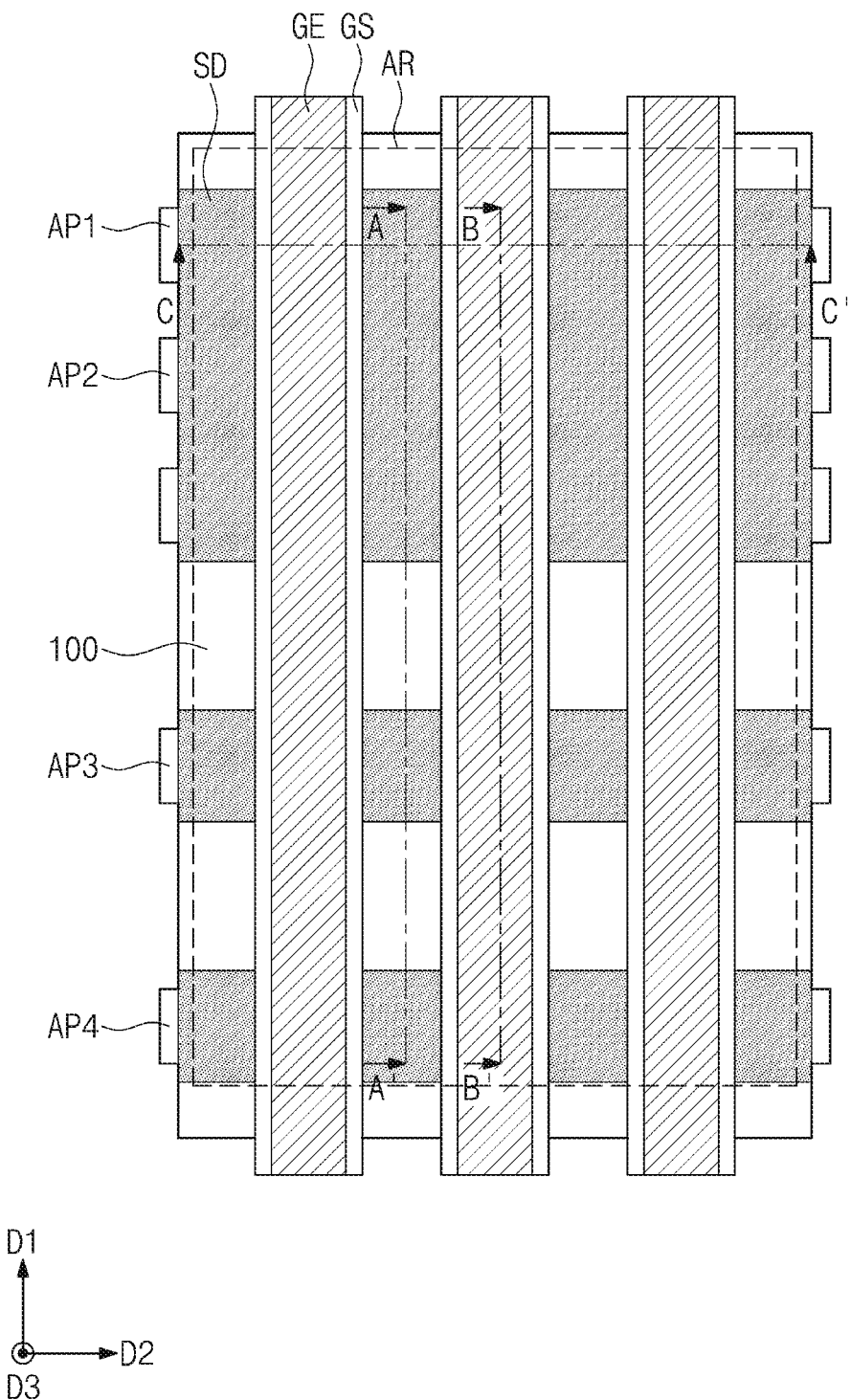
FIG. 18 is a plan view illustrating a semiconductor device according to some embodiments of the inventive concepts.
Figure 19A:
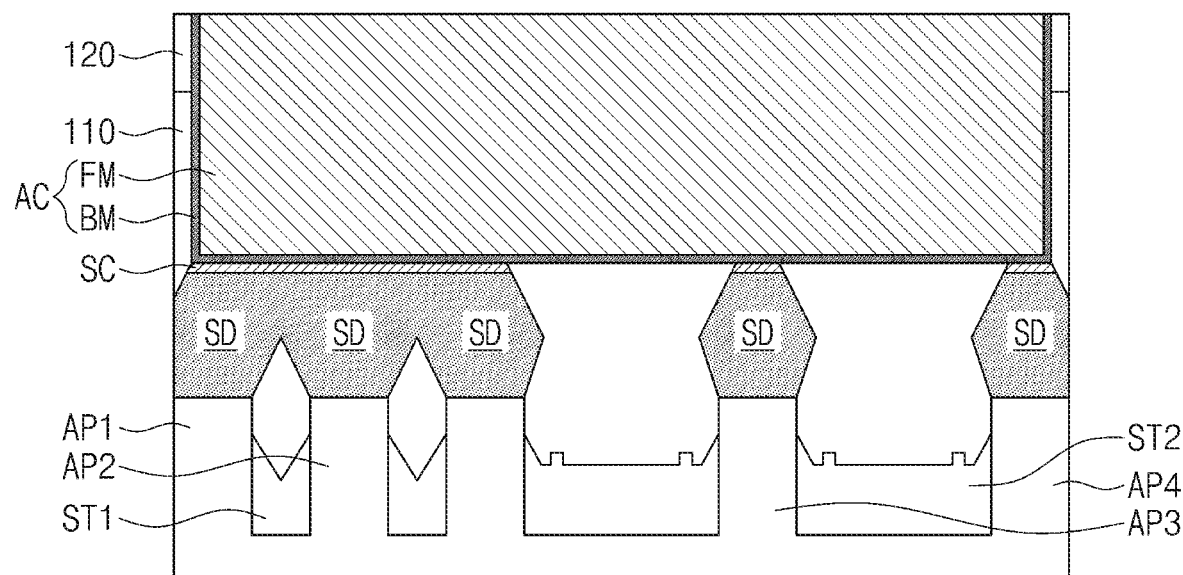
FIGS. 19A, 19B and 19C are cross-sectional views taken along lines A-A', B-B' and C-C' of FIG. 18, respectively.
Figure 19B:
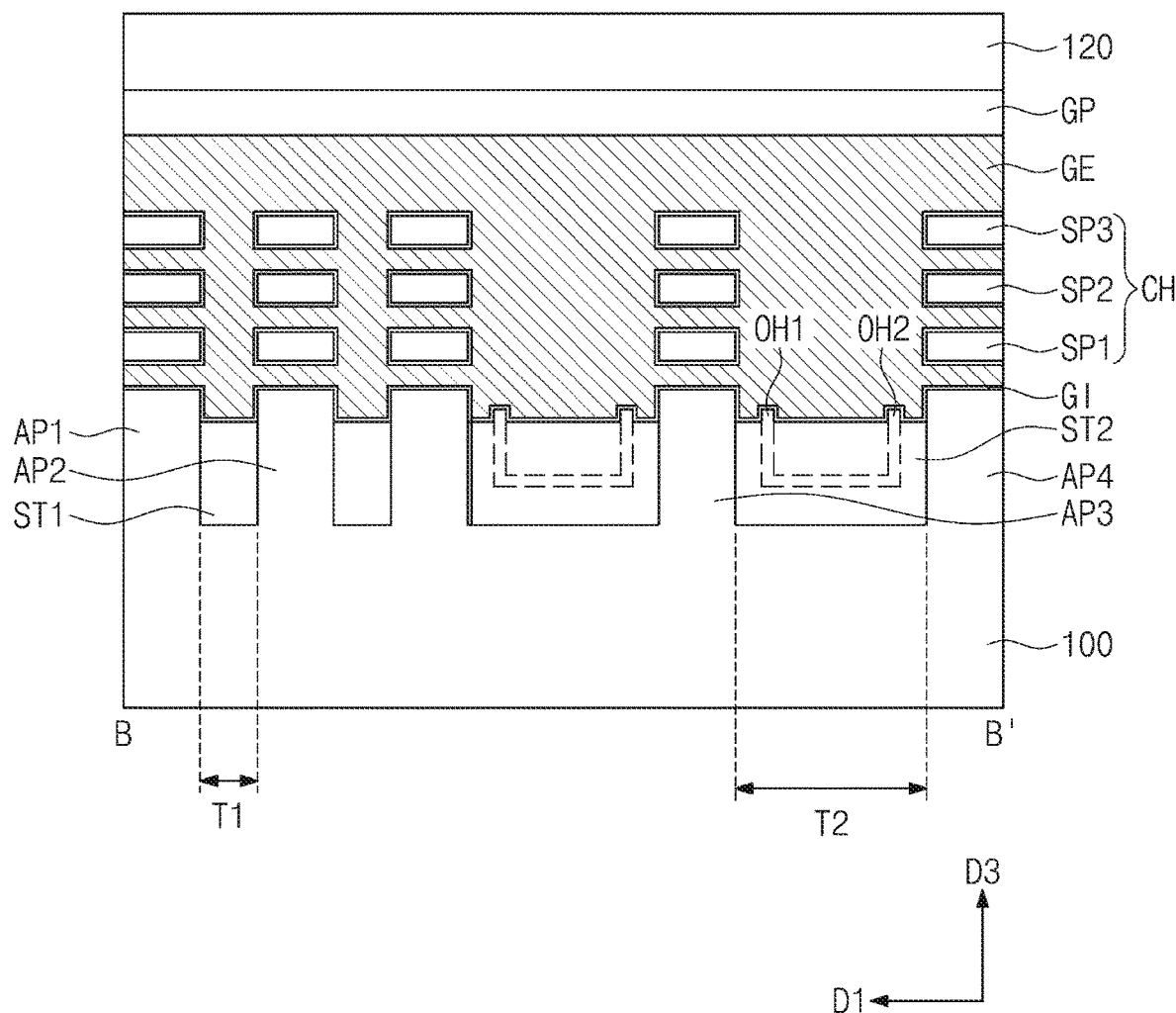
Figure 19C:
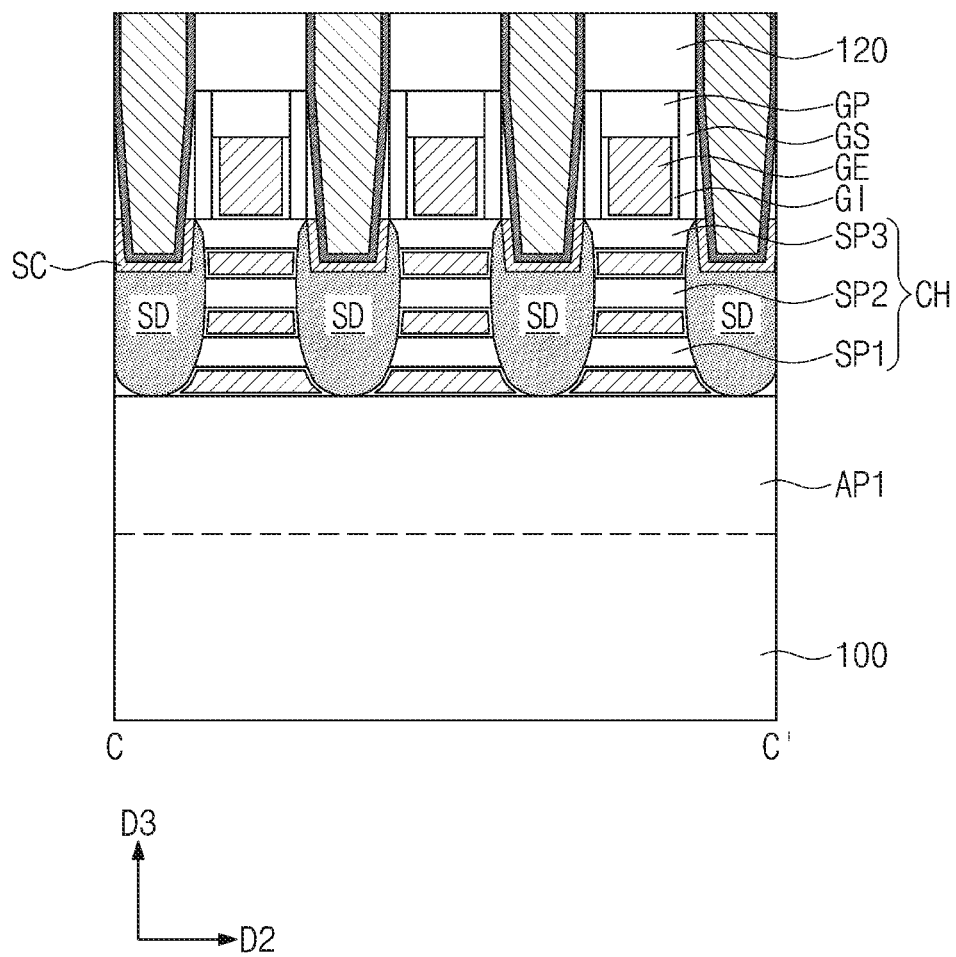

FIG. 18 is a plan view illustrating a semiconductor device according to some embodiments of the inventive concepts. FIGS. 19A, 19B and 19C are cross-sectional views taken along lines A-A', B-B' and C-C' of FIG. 18, respectively. Hereinafter, the descriptions to the same technical features as mentioned with reference to FIGS. 7 and 8A to 8C will be omitted for the purpose of ease and convenience in explanation. In other words, differences between the present embodiments and the embodiments of FIGS. 7 and 8A to 8C will be mainly described.

Referring to FIGS. 18 and 19A to 19C, a substrate 100 including an active region AR may be provided. The substrate 100 may be patterned to form first to fourth active patterns AP1, AP2, AP3 and AP4 on the active region AR. A first device isolation layer ST1 may be formed between the first active pattern AP1 and the second active pattern AP2, and a second device isolation layer ST2 may be formed between the third active pattern AP3 and the fourth active pattern AP4. A width T2 of the second device isolation layer ST2 may be greater than a width T1 of the first device isolation layer ST1. The second device isolation layer ST2 may include a first protrusion OH1 and a second protrusion OH2 which protrude from its top surface.

Each of the first to fourth active patterns AP1 to AP4 may include a channel pattern CH including semiconductor patterns SP1 to SP3 that are vertically stacked. The stacked semiconductor patterns SP1 to SP3 may be spaced apart from each other in a third direction D3 that is perpendicular to the substrate 100. The stacked semiconductor patterns SP1 to SP3 may vertically overlap with each other. The stacked semiconductor patterns SP1 to SP3 may function as channel regions. The semiconductor patterns SP1 to SP3 may include at least one of silicon (Si), germanium (Ge), or silicon-germanium (SiGe).

The first to fourth active patterns AP1, AP2, AP3 and AP4 may further include source/drain patterns SD. The stacked semiconductor patterns SP1 to SP3 may be disposed between a pair of the source/drain patterns SD adjacent to each other. The stacked semiconductor patterns SP1 to SP3 may connect the pair of source/drain patterns SD adjacent to each other.

Gate electrodes GE may intersect the channel patterns CH and may extend in the first direction D1. The gate electrode GE may vertically overlap with the channel patterns CH. A pair of gate spacers GS may be disposed on both sidewalls of the gate electrode GE, respectively. A gate capping pattern GP may be provided on the gate electrode GE.

A gate dielectric pattern GI may be provided between the gate electrode GE and each of the semiconductor patterns SP1 to SP3. The gate dielectric pattern GI may surround each of the semiconductor patterns SP1 to SP3. The gate dielectric pattern GI may cover or overlap top surfaces of the first and second protrusions OH1 and OH2 on the second device isolation layer ST2.

A first interlayer insulating layer 110 and a second interlayer insulating layer 120 may be provided on an entire top surface of the substrate 100. Active contacts AC may penetrate the second and first interlayer insulating layers 120 and 110 so as to be connected to the source/drain patterns SD.

The gate electrode GE may surround each of the semiconductor patterns SP1 to SP3 (see FIG. 19B). The gate electrode GE may be provided on a top surface, at least one sidewall and a bottom surface of each of the semiconductor patterns SP1 to SP3. In other words, the gate electrode GE may surround the top surface, the bottom surface and both sidewalls of each of the semiconductor patterns SP1 to SP3. In other words, the gate electrode GE may be between semiconductor patterns SP1 to SP3 in addition to be being adjacent the semiconductor patterns SP1 to SP3 in the direction D1 that is parallel to the substrate 100. A transistor according to the present embodiment may be a 3D field effect transistor (e.g., MBCFET) in which the gate electrode GE three-dimensionally surrounds each of the semiconductor patterns SP1 to SP3.

Figure 20:
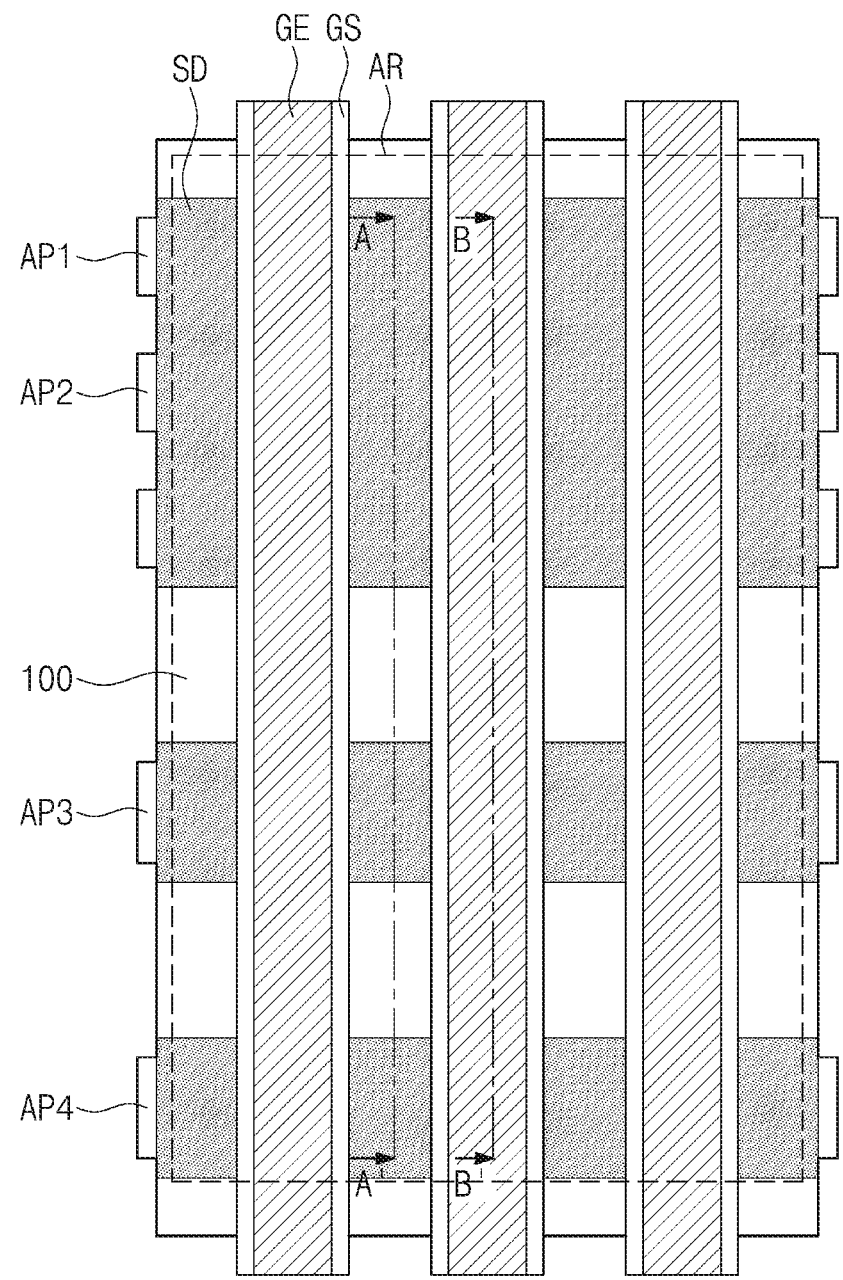
FIG. 20 is a plan view illustrating a semiconductor device according to some embodiments of the inventive concepts.
Figure 21A:
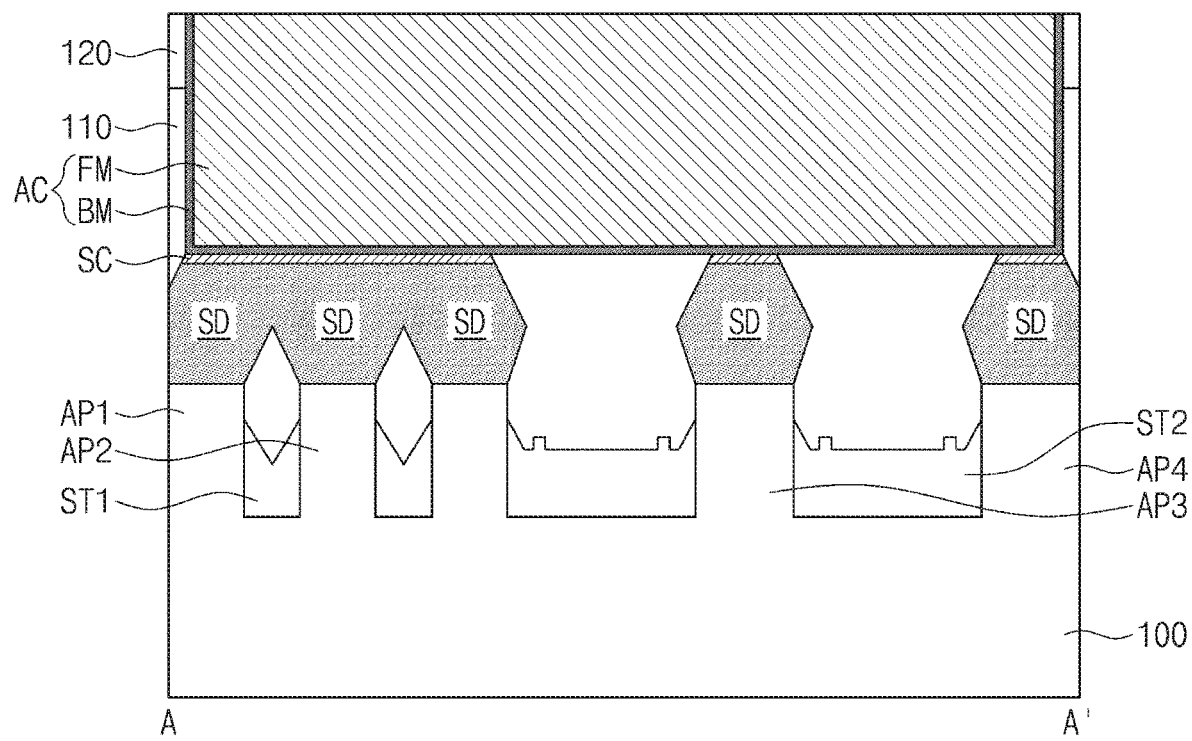
FIGS. 21A and 21B are cross-sectional views taken along lines A-A' and B-B' of FIG. 20, respectively.
Figure 21A:
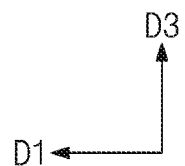
Figure 21B:
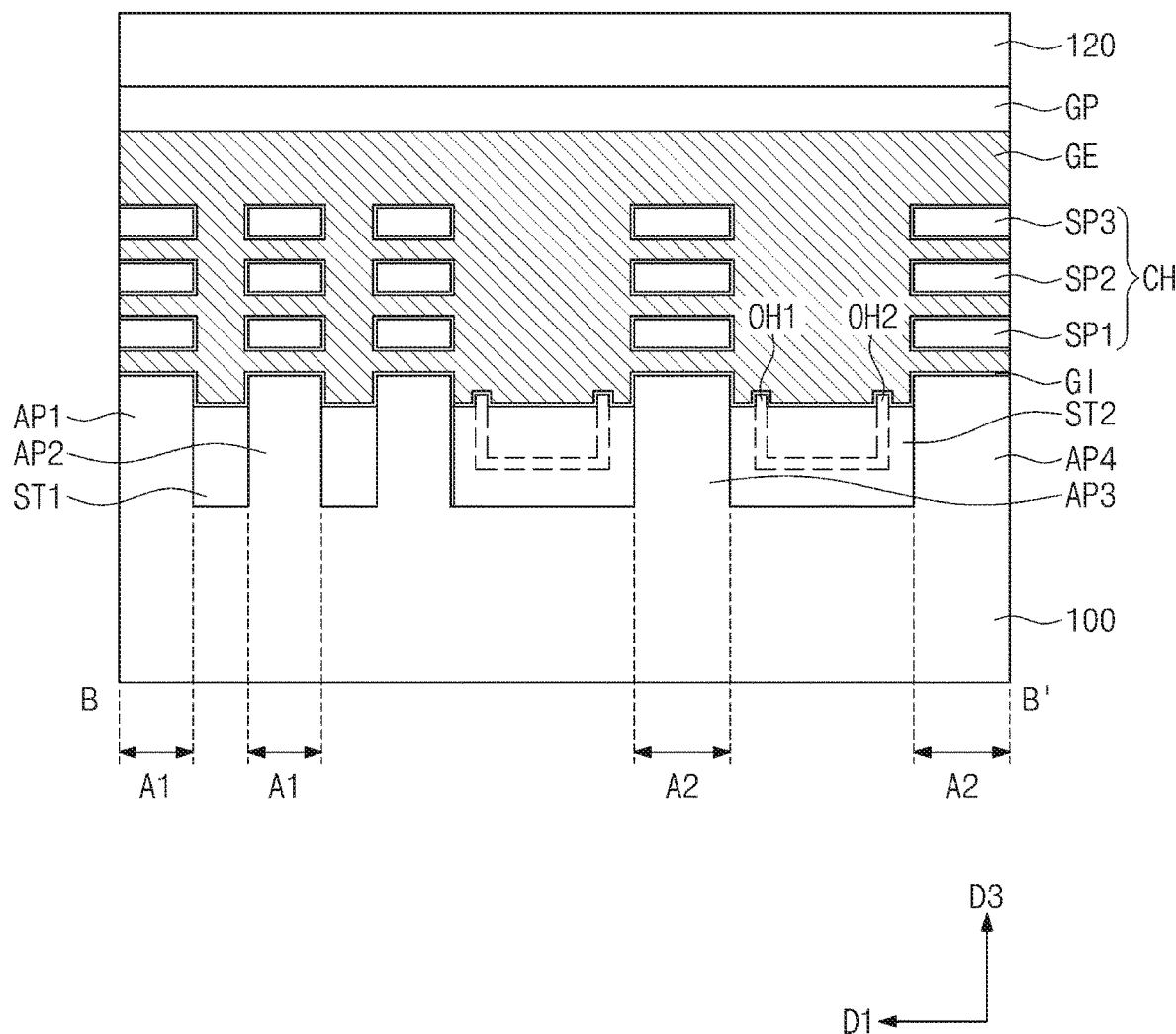

FIG. 20 is a plan view illustrating a semiconductor device according to some embodiments of the inventive concepts. FIGS. 21A and 21B are cross-sectional views taken along lines A-A' and B-B' of FIG. 20, respectively. Hereinafter, the descriptions to the same technical features as mentioned with reference to FIGS. 18 and 19A to 19C will be omitted for the purpose of ease and convenience in explanation. In other words, differences between the present embodiments and the embodiments of FIGS. 18 and 19A to 19C will be mainly described.

Referring to FIGS. 20, 21A and 21B, widths A1 of the first and second active patterns AP1 and AP2 adjacent to the first device isolation layer ST1 in the first direction D1 may be equal to each other. Widths A2 of the third and fourth active patterns AP3 and AP4 adjacent to the second device isolation layer ST2 in the first direction D1 may be equal to each other. In some embodiments, the width A2 of each of the third and fourth active patterns AP3 and AP4 in the first direction D1 may be greater than the width A1 of each of the first and second active patterns AP1 and AP2 in the first direction D1.

According to the embodiments of the inventive concepts, the liner layer may be deposited on the insulating layer in the process of forming the device isolation layer, as illustrated in FIGS. 2C and 2D. Thus it may be possible to improve the etch resistance (e.g., a wet etch resistance) of the device isolation layer having a relatively great width.

While the inventive concepts have been described with reference to example embodiments, it will be apparent to those skilled in the art that various changes and modifications may be made without departing from the spirits and scopes of the inventive concepts. Therefore, it should be understood that the above embodiments are not limiting, but illustrative. Thus, the scopes of the inventive concepts are to be determined by the broadest permissible interpretation of the following claims and their equivalents, and shall not be restricted or limited by the foregoing description.

What is claimed is:

1. A semiconductor device comprising:
    a first active pattern and a second active pattern on a substrate, the first and second active patterns adjacent to each other in a first direction with a first trench between the first and second active patterns;
    a third active pattern and a fourth active pattern on the substrate, the third and fourth active patterns adjacent to each other in the first direction with a second trench between the third and fourth active patterns;
    a first device isolation layer in the first trench; and
    a second device isolation layer in the second trench,
    wherein a width of the second trench in the first direction is greater than a width of the first trench in the first direction,
    wherein the second device isolation layer comprises a first protrusion and a second protrusion which protrude from a top surface of the second device isolation layer, and
    wherein the first protrusion and the second protrusion are spaced apart from the third and fourth active patterns.

2. The semiconductor device of claim 1, wherein a distance between the third active pattern and the first protrusion is substantially equal to a distance between the fourth active pattern and the second protrusion.

3. The semiconductor device of claim 1, wherein an aspect ratio of the first device isolation layer ranges from 25 to 100.

4. The semiconductor device of claim 1, wherein an aspect ratio of the second device isolation layer ranges from 1 to 20.

5. The semiconductor device of claim 1, wherein a width of each of the third and fourth active patterns in the first direction is greater than a width of each of the first and second active patterns in the first direction.

6. The semiconductor device of claim 1, further comprising:
    source/drain patterns provided in upper portions of the first to fourth active patterns; and
    a gate electrode intersecting the first to fourth active patterns.

7. The semiconductor device of claim 6, wherein the upper portions of the first to fourth active patterns protrude from the first and second device isolation layers in a direction perpendicular to the substrate.

8. The semiconductor device of claim 6,
    wherein each of the first to fourth active patterns comprises a channel pattern comprising semiconductor patterns that are vertically stacked, and
    wherein the gate electrode is on a top surface, a bottom surface and both sidewalls of each of the semiconductor patterns.

9. A semiconductor device comprising:
    a substrate comprising an active region;
    a device isolation layer on the substrate that defines active patterns on the active region, wherein the active patterns are spaced apart in a first direction;
    source/drain patterns in upper portions of the active patterns;
    gate electrodes intersecting the active patterns and extending in the first direction, wherein the gate electrodes are in a second direction intersecting the first direction; and
    an interlayer insulating layer overlapping the source/drain patterns and the gate electrodes,
    wherein the active patterns comprise a first active pattern and a second active pattern adjacent to each other in the first direction, and a third active pattern and a fourth active pattern adjacent to each other in the first direction,
    wherein the device isolation layer comprises a first device isolation layer between the first and second active patterns, and a second device isolation layer between the third and fourth active patterns,
    wherein a width of the second device isolation layer in the first direction is greater than a width of the first device isolation layer in the first direction,
    wherein the second device isolation layer comprises a first protrusion and a second protrusion which protrude from a top surface of the second device isolation layer, and
    wherein the first protrusion and the second protrusion are spaced apart from the third and fourth active patterns.

10. The semiconductor device of claim 9, wherein the active region is a PMOSFET region or an NMOSFET region.

11. The semiconductor device of claim 9, wherein a distance between the third active pattern and the first protrusion is substantially equal to a distance between the fourth active pattern and the second protrusion.

12. The semiconductor device of claim 9, wherein an aspect ratio of the first device isolation layer ranges from 25 to 100.

13. The semiconductor device of claim 9, wherein an aspect ratio of the second device isolation layer ranges from 1 to 20.

14. The semiconductor device of claim 9, wherein a width of each of the third and fourth active patterns in the first direction is greater than a width of each of the first and second active patterns in the first direction.

15. A semiconductor device comprising:
a first active pattern and a second active pattern on a substrate with a first trench therebetween;
a third active pattern and a fourth active pattern on the substrate, with a second trench therebetween;
a first device isolation layer in the first trench;
a second device isolation layer in the second trench;
a plurality of semiconductor patterns that are vertically stacked on the active patterns; and
a gate electrode overlapping the active patterns, the first trench and the second trench and extending between ones of the plurality of semiconductor patterns,
wherein a first distance between the first active pattern and the second active pattern is less than a second distance between the third active pattern and the fourth active pattern,
wherein the second device isolation layer comprises a first protrusion and a second protrusion which protrude from a top surface of the second device isolation layer,
wherein the first protrusion and the second protrusion are spaced apart from the third and fourth active patterns.

16. The semiconductor device of claim 15, wherein the first protrusion and the second protrusion protrude into the gate electrode.

17. The semiconductor device of claim 15, further comprising:
a gate dielectric pattern on top surfaces of the first protrusion and the second protrusion, overlapping the second device isolation layer.

18. The semiconductor device of claim 15, wherein a distance between the third active pattern and the first protrusion is substantially equal to a distance between the fourth active pattern and the second protrusion.

19. The semiconductor device of claim 15, wherein an aspect ratio of the first device isolation layer ranges from 25 to 100.

20. The semiconductor device of claim 15, wherein an aspect ratio of the second device isolation layer ranges from 1 to 20.

* * * * *